(12) United States Patent
Ota et al.

(10) Patent No.: US 8,884,152 B2
(45) Date of Patent: Nov. 11, 2014

(54) THERMOELECTRIC SEMICONDUCTOR MATERIAL, THERMOELECTRIC SEMICONDUCTOR ELEMENT USING THERMOELECTRIC SEMICONDUCTOR MATERIAL, THERMOELECTRIC MODULE USING THERMOELECTRIC SEMICONDUCTOR ELEMENT AND MANUFACTURING METHOD FOR SAME

(71) Applicant: IHI Corporation, Tokyo (JP)

(72) Inventors: Toshinori Ota, Tokyo (JP); Hirold Yoshizawa, Funabashi (JP); Kouiti Fujita, Miura (JP); Isao Imai, Fujisawa (JP); Tsuyoshi Tosho, Hokkaido (JP); Ujihiro Nishiike, Tokyo (JP)

(73) Assignee: IHI Corporation (JP)

( * ) Notice: Subject to any disclaimer, the term of this patent is extended or adjusted under 35 U.S.C. 154(b) by 0 days.

(21) Appl. No.: 14/187,858

(22) Filed: Feb. 24, 2014

(65) Prior Publication Data

US 2014/0170794 A1 Jun. 19, 2014

Related U.S. Application Data

(63) Continuation of application No. 13/083,666, filed on Apr. 11, 2011, now Pat. No. 8,692,103, which is a continuation of application No. 10/555,855, filed as application No. PCT/JP2004/006493 on May 7, 2004, now abandoned.

(30) Foreign Application Priority Data

May 8, 2003 (JP) ................................. 2003-130618

(51) Int. Cl.
| | | |
|---|---|---|
| *H01L 35/34* | (2006.01) | |
| *B22D 11/06* | (2006.01) | |
| *H01L 35/16* | (2006.01) | |

(52) U.S. Cl.
CPC ............ *H01L 35/34* (2013.01); *B22D 11/0611* (2013.01); *H01L 35/16* (2013.01)
USPC ......................................... 136/201; 136/238

(58) Field of Classification Search
USPC .................................................. 136/201, 238
See application file for complete search history.

(56) References Cited

U.S. PATENT DOCUMENTS 4,764,212 A * 8/1988 Okumura ......................... 75/228
6,274,802 B1 * 8/2001 Fukuda et al. ................. 136/201
(Continued)

FOREIGN PATENT DOCUMENTS

| CN | 1233347 A | 1/1999 |
|---|---|---|
| JP | 63-138789 | 6/1988 |

(Continued)

OTHER PUBLICATIONS

International Search Report PCT/JP2004/006493 dated Jul. 20, 2004.

(Continued)

*Primary Examiner* — Golam Mowla
(74) *Attorney, Agent, or Firm* — Ostrolenk Faber LLP

(57) ABSTRACT

A metal mixture is prepared, in which an excess amount of Te is added to a $(Bi\text{—}Sb)_2Te_3$ based composition. After melting the metal mixture, the molten metal is solidified on a surface of a cooling roll of which the circumferential velocity is no higher than 5 m/sec, so as to have a thickness of no less than 30 μm. Thus, a plate shaped raw thermoelectric semiconductor materials 10 are manufactured, in which Te rich phases are microscopically dispersed in complex compound semiconductor phases, and extending directions of C face of most of crystal grains are uniformly oriented. The raw thermoelectric semiconductor materials 10 are layered in the direction of the plate thickness. And the layered body is solidified and formed to form a compact 12. After that, the compact 12 is plastically deformed in such a manner that a shear force is applied in a uniaxial direction that is approximately parallel to the main layering direction of the raw thermoelectric semiconductor materials 10. As a result, a thermoelectric semiconductor 17 having crystal orientation in which extending direction of C face and the direction of c-axis of the hexagonal structure are approximately aligned. As a result, the crystalline orientation is improved, and the thermoelectric Figure-of-Merit is increased.

9 Claims, 19 Drawing Sheets

(56) References Cited

U.S. PATENT DOCUMENTS

| | | | |
|---|---|---|---|
| 6,313,392 B1 * | 11/2001 | Sato et al. | 136/201 |
| 6,319,744 B1 * | 11/2001 | Hoon et al. | 438/54 |

FOREIGN PATENT DOCUMENTS

| | | |
|---|---|---|
| JP | 05-335628 | 12/1993 |
| JP | 05-335628 A | 12/1993 |
| JP | 08-199281 | 8/1996 |
| JP | 10-117021 | 5/1998 |
| JP | 10-117021 A | 5/1998 |
| JP | 10/178218 | 6/1998 |
| JP | 10-178219 | 6/1998 |
| JP | 11-163422 | 6/1999 |
| JP | 11-261119 | 9/1999 |
| JP | 2000-036627 | 2/2000 |
| JP | 2000-124512 | 4/2000 |
| JP | 2000-124512 A | 4/2000 |
| JP | 2000-286471 | 10/2000 |
| JP | 2000-286471 A | 10/2000 |
| JP | 2000-332307 | 11/2000 |
| JP | 2000-357821 | 12/2000 |
| JP | 2001-053344 | 2/2001 |
| JP | 2001-053344 A | 2/2001 |
| JP | 2001-160633 | 6/2001 |
| JP | 2001-160633 A | 6/2001 |
| JP | 2001-345487 | 12/2001 |
| JP | 2002-111086 | 4/2002 |
| JP | 2002-111086 A | 4/2002 |
| JP | 2002-118299 | 4/2002 |
| JP | 2002-151751 | 5/2002 |
| JP | 2003-37302 | 2/2003 |
| JP | 2003-037302 A | 2/2003 |
| WO | WO98/11612 | 3/1998 |

OTHER PUBLICATIONS

Hiroshi Kato and Keiji Yoshikawa, "Elastic Constants of Al-Cu Alloys Containing Columinar Crystals" Apr. 1981, Journal of the Society of Materials Science, vol. 30, No. 331.

Horio et al., JP 2003-037302, An online machine translation, Jul. 2, 2003.

Office Action in corresponding Chinese Application No. 200480019353.0 dated Aug. 22, 2008 with English translation.

Online Machine Translation of JP2000-286471 A provided by the Industrial Property Digital Library (IPDL) (http://www.ipdl/inpit.go.jp/homepg_e.ipdl).

Office Action dated May 10, 2013 issued in the parent case, U.S. Appl. No. 13/083,666.

Office Action dated Jan. 17, 2013 issued in the parent case, U.S. Appl. No. 13/083,666.

Office Action dated Sep. 25, 2009 issued in the parent case, U.S. Appl. No. 10/555,855.

Office Action dated Mar. 1, 2010 issued in the parent case, U.S. Appl. No. 10/555,855.

Office Action dated Sep. 2, 2010 issued in the parent case, U.S. Appl. No. 10/555,855.

Office Action dated May 24, 2011 issued in the parent case, U.S. Appl. No. 10/555,855.

Office Action dated Dec. 6, 2011 issued in the parent case, U.S. Appl. No. 10/555,855.

Office Action dated Jul. 9, 2013 issued in the parent case, U.S. Appl. No. 10/555,855.

* cited by examiner

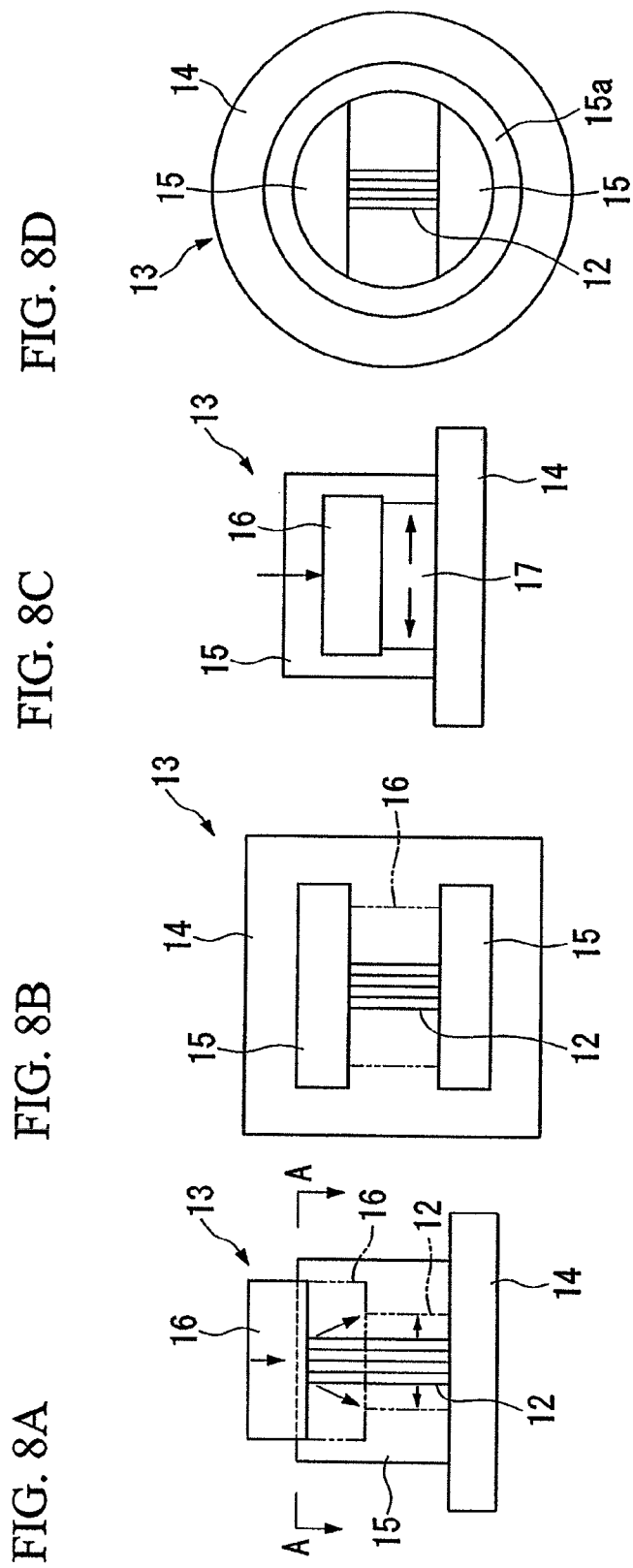

THERMOELECTRIC SEMICONDUCTOR MATERIAL, THERMOELECTRIC SEMICONDUCTOR ELEMENT USING THERMOELECTRIC SEMICONDUCTOR MATERIAL, THERMOELECTRIC MODULE USING THERMOELECTRIC SEMICONDUCTOR ELEMENT AND MANUFACTURING METHOD FOR SAME

CROSS REFERENCE TO RELATED APPLICATIONS

The present application is a continuation under 37 C.F.R. §1.53(b) of U.S. patent application Ser. No. 13/083,666, filed Apr. 11, 2011, which in turn is a continuation of U.S. patent application Ser. No. 10/555,855, filed Nov. 7, 2005, which is a U.S.C. §371 national phase conversion of PCT/JP2004/006493 filed May 7, 2004, which claims priority of Japanese Application No. 2003-130618, filed May 8, 2003, the contents of each of which are incorporated in full by reference herein.

TECHNICAL FIELD

The present invention relates to a thermoelectric semiconductor material as well as to a thermoelectric semiconductor element, a thermoelectric module, and manufacturing method for same that are utilized for thermoelectric cooling, thermoelectric heating, thermoelectric power generation or the like.

BACKGROUND ART

Devices for carrying out thermoelectric cooling, thermoelectric heating and thermoelectric power generation using the thermoelectric properties of a thermoelectric semiconductor generally have a basic configuration where a plurality of thermoelectric modules 1 are aligned and connected in series, as shown schematically in the example of FIG. 27. In each of the thermoelectric modules 1, a PN element pair is formed by joining a P type thermoelectric semiconductor element 2 to an N type thermoelectric semiconductor element 3 via a metal electrode 4.

One type of thermoelectric semiconductor that forms above described thermoelectric semiconductor elements 2 and 3 uses a complex compound made of one or two elements selected from bismuth (Bi) and antimony (Sb) of 5B group, and one or two elements selected from tellurium (Te) and selenium (Se) of 6B group. The thermoelectric semiconductor is made of an alloy having a (Bi—Sb)$_2$(Te—Se)$_3$ based composition in which the ratio of a number of atoms of 5B group elements (Bi and Sb) to a number of atoms of 6B group elements (Te and Se) is 2:3.

Above-described alloy having a (Bi—Sb)$_2$(Te—Se)$_3$ based composition for forming the thermoelectric semiconductor, has a hexagonal structure, and electrical and thermal anisotropy due to the crystal structure. It is known that by conveying electricity or heat in the <110> direction of the crystal structure, that is, along C face of the hexagonal structure, excellent thermoelectric performance can be obtained, in comparison with a case where electricity or heat is conveyed in the direction of c-axis.

Conventionally, raw alloys prepared so as to have the above-described desired composition are heated and melted to form molten alloys. Subsequently, using a directional solidification method, such as a zone melting method, while controlling the direction of the crystal growth so that the crystal has an excellent thermoelectric performance along the growth direction, a single crystalline or a polycrystalline ingot is manufactured as a thermoelectric semiconductor material. By a required working of the ingot, such as cutting a portion having little irregularity in the composition from the ingot and working the cut portion, an element having an excellent properties is manufactured.

However, the ingots converted to single crystal using the zone melting method have significant cleavage due to their crystal structure. Therefore, when a thermoelectric semiconductor element is manufactured by slicing or the like of the ingot as a thermoelectric semiconductor material, there is a problem that the insufficient mechanical strength cause a reduction of yields by cracking or chipping. Therefore, it has been desired to improve thermoelectric performance along with increasing the strength of thermoelectric semiconductor materials for thermoelectric semiconductor elements.

In order to improve the strength and thermoelectric performance of thermoelectric semiconductors, one technique is proposed in which an ingot as a thermoelectric semiconductor material which has been manufactured in the same manner as described above by a directional solidification method, is worked by extrusion or rolling so as to apply shear force in the direction of C face of a hexagonal structure, and thereby improving the strength of the material (see, for example, Patent Document 1).

There has been proposed several method in view of general properties of polycrystalline metallic material as following: Crystal grains of polycrystalline metallic material show dispersive distribution of orientation, the metallic material exhibits isotropy. When the crystal grains are oriented in a specific direction as a result of a working such as plastic working, crystal anisotropy of individual crystal grains appears as macroscopic characteristics so that the metallic material as a whole exhibits anisotropy (for example, Non-Patent Document 1). By crushing raw alloy powder and sintering the powder, mechanical property of the material is improved in the sintered body. In the sintered body crystalline orientation is reduced, since the integration of randomly oriented powder grains during the sintering process orientates constituent crystals randomly. By rolling the sintered body in a direction (see, for example, Patent Document 2), by extrusion molding the sintered body (see, for example, Patent Documents 3 and 4), or by plastically deforming the sintered body (see, for example Patent Documents 5, 6, 7, 8, 9 and 10), uniformity of crystalline orientation of the sintered body is improved.

That is to say, by applying a pressing force on the above-described sintered body, and plastically deforming the sintered body, constituent crystals of the texture are plastically deformed and flattened in a direction perpendicular to the direction of pressing force, and thus, the crystals are oriented in such a manner that the cleavage plane are perpendicular to the direction of compression. In a rolling or a forging by an uniaxial compression, C face of the hexagonal structure is oriented in the direction perpendicular to the direction of compressing the sintered body (direction of pressing). In an extrusion molding, C face of the hexagonal structure is oriented along the direction of extrusion (direction of pressing). By this method, it is possible to prepare a thermoelectric semiconductor material in which crystals are oriented in a direction of excellent thermoelectric performance.

In general, the thermoelectric performance of the material used for the manufacture of a thermoelectric semiconductor is expressed by the following equation:

$$Z=\alpha^2\sigma/\kappa=\alpha^2/(\sigma\cdot\kappa)$$

where Z is a Figure-of-Merit, $\alpha$ is the Seebeck coefficient, $\sigma$ is electric conductivity, $\kappa$ is thermal conductivity, and $\rho$ is resistivity.

Accordingly, in order to increase the thermoelectric performance (Figure-of-Merit Z) of a thermoelectric semiconductor material, a raw alloy material in which the value of the Seebeck coefficient ($\pi$) or the electric conductivity ($\sigma$) is increased, or the thermal conductivity ($\kappa$) is lowered, may be utilized.

Judging from this, it should be possible to increase thermoelectric performance (Figure-of-Merit Z) by decreasing the grain sizes of crystals and reducing the conductivity ($\kappa$). However, in the above-described techniques using a powder produced by crushing an ingot of the raw alloy, the particle sizes of the powder is the grain sizes of crystals, therefore there is a limit to the miniaturization of crystal grains formed by crushing.

Therefore, in order to improve the strength and thermoelectric performance of a thermoelectric semiconductor material, still another technique has been proposed. A raw alloy is melted into a molten alloy. A raw thermoelectric semiconductor material in a ribbon, foil piece or powder form is formed by a liquid quenching method such as rotational roll method in which the molten alloy is sprayed onto the surface of a rotational roll which is being rotated or a gas atomizing method in which the molten alloy is sprayed into a predetermined gas flow. At that time, microscopic crystal grains are formed within the texture of the raw thermoelectric semiconductor material, and high density strain and defects are introduced into the texture. After the raw thermoelectric semiconductor material is crushed into a powder, this raw thermoelectric semiconductor material in powder form is heat treated and solidified, and thereby a thermoelectric semiconductor material is manufactured. By this method, during the heat treatment or the solidification process, recrystallization of crystals occurs using the distortion due to the defects as a driving force, and due to the presence of grain boundaries, the thermal conductivity ($\kappa$) is lowered and thermoelectric performance (Figure-of-Merit Z) is increased (see, for example, Patent Document 11).

As the rotational velocity of a rotational roll that is used to form a raw thermoelectric semiconductor material in a ribbon, foil piece or powder form by quenching a molten alloy, it is proposed to set a circumferential velocity to be 2 to 80 m/sec, so as to effectively generate microscopic crystals by quenching, and make the crystals grow in the direction of heat flow (see, for example, Patent Document 12). In this case, a sufficient quenching speed is not achieved when the circumferential velocity of the rotational roll is less than 2 m/sec, and a sufficient quenching speed is also not achieved when the circumferential velocity is 80 m/sec or greater.

As the heating conditions when the raw thermoelectric semiconductor material in a ribbon, foil or powder form is solidified and formed, it is proposed to maintain the material at a temperature from 200 to 400° C. or at a temperature from 400 to 600° C. for 5 to 150 minutes while applying pressure to the material (see, for example, Patent Document 13).

Another technique for increasing the thermoelectric performance of a thermoelectric semiconductor material is proposed, in which Ag is added to and mixed with a raw thermoelectric semiconductor material in a ribbon, foil piece or powder form that has been formed by quenching a molten alloy of a $(Bi—Sb)_2(Te—Se)_3$ based raw alloy, on a rotational roll. By subsequent sintering and solidification, Ag is distributed in the grain boundaries, so that resistivity $\rho$ is lowered, and thus, an increase in the thermoelectric performance (Figure-of-Merit Z) can be achieved (see, for example, Patent Document 14).

It is known that in a rotational rolling method as the liquid quenching method, a molten alloy sprayed onto the surface of a rotational roll is cooled from contact surface with the rotational roll in the direction toward the outer periphery of the roll. Together with this quenching, the molten alloy solidifies in the direction of the film thickness. As a result, a raw thermoelectric semiconductor material in foil form is produced, in which C face, the base plane of the hexagonal structure of the crystal grains, stand in the direction of the film thickness.

Therefore, a technique for effectively using the orientation of the crystals of a raw thermoelectric semiconductor material that has been manufactured by the rotational rolling method is proposed, in which the raw thermoelectric semiconductor materials are layered in the direction of the film thickness, and are sintered while pressure is applied in the direction parallel to the direction of the film thickness, and thereby, a thermoelectric semiconductor material is manufactured (see, for example, Patent Document 15).

Furthermore, techniques for manufacturing a thermoelectric semiconductor material in which crystal orientation is improved have been proposed. In a technique, a layered body is produced by layering raw thermoelectric semiconductor materials manufactured by a rotational rolling method, and integrating the layered body layered in the direction of the film thickness by applying a pressure in the direction parallel to the layering direction. During the pressing for integrating the layers in the direction parallel to the layering direction, crystal orientation of each layers are disordered at the interface of the layers. By applying pressure in the direction perpendicular to the layering direction of the layered body, such disorder of crystal orientation at the interface can be improved (see, for example, Patent Document 16). In another technique, a layered body is produced by layering raw thermoelectric semiconductor materials in foil powder form in the direction of the film thickness. Crystalline orientation of the layered body is improved by applying pressure in at least three directions perpendicular to the layering direction. Furthermore, the layered body, the crystalline orientation of which has been improved by the above-described application of pressure, is formed by extrusion molding in the direction parallel to the layering direction, and thereby uniformity in the orientation of the crystals is additionally increased (see, for example, Patent Document 17).

Recently, it has been desired for a thermoelectric transducing material to be provided with further improved performance and high reliability. Together with an increase in performance, an increase in mechanical strength and excellence in workability are also desired. For example, when a thermoelectric semiconductor is used to cool a laser oscillator, N type and P type thermoelectric semiconductor elements having dimensions of no greater than 1 mm are used as modules. Accordingly, it is required a mechanical strength sufficient to make it possible for a thermoelectric semiconductor element of no greater than 1 mm in dimension to be sliced from an ingot of a thermoelectric semiconductor material without chipping.

LIST OF PRIOR ART DOCUMENTS (1) Patent Document 1: Japanese Unexamined Patent Application, First Publication No. H11-163422
(2) Patent Document 2: Japanese Unexamined Patent Application, First Publication No. S63-138789
(3) Patent Document 3: Japanese Unexamined Patent Application, First Publication No. 2000-124512
(4) Patent Document 4: Japanese Unexamined Patent Application, First Publication No. 2001-345487

(5) Patent Document 5: Japanese Unexamined Patent Application, First Publication No. 2002-118299
(6) Patent Document 6: Japanese Unexamined Patent Application, First Publication No. H10-178218
(7) Patent Document 7: Japanese Unexamined Patent Application, First Publication No. 2002-151751
(8) Patent Document 8: Japanese Unexamined Patent Application, First Publication No. H11-261119
(9) Patent Document 9: Japanese Unexamined Patent Application, First Publication No. H10-178219
(10) Patent Document 10: Japanese Unexamined Patent Application, First Publication No. 2002-111086
(11) Patent Document 11: Japanese Unexamined Patent Application, First Publication No. 2000-36627
(12) Patent Document 12: Japanese Unexamined Patent Application, First Publication No. 2000-286471
(13) Patent Document 13: Japanese Unexamined Patent Application, First Publication No. 2000-332307
(14) Patent Document 14: Japanese Unexamined Patent Application, First Publication No. H8-199281
(15) Patent Document 15: Japanese Patent Publication No. 2659309
(16) Patent Document 16: Japanese Unexamined Patent Application, First Publication No. 2001-53344
(17) Patent Document 17: Japanese Unexamined Patent Application, First Publication No. 2000-357821
(18) Non-Patent Document 1: "Elastic Constants of Al—Cu Alloys Containing Columnar Crystals" by Hiroshi Kato and Keiji Yoshikawa, Materials (Journal of the Society of Materials Science, Japan), Volume 30, No. 331, April 1981, p. 85.

There is a problem, however, in that the mechanical strength of a thermoelectric semiconductor material cannot be sufficiently enhanced, even when the thermoelectric semiconductor material is manufactured by plastically deforming an ingot of a thermoelectric semiconductor raw alloy, as shown in Patent Document 1.

At present, it is difficult to overcome the problem in which a single-crystal or directionally solidified ingot easily cracks along the cleavage plane of the material. Even though the orientation of the crystals is uniform, there are few methods for still increasing performance, because the manufacturing methods are limited.

Among techniques for manufacturing a polycrystalline thermoelectric semiconductor material, as shown in Patent Documents 2 to 10, by a technique for plastically deforming a sintered body by rolling, by an extrusion molding, or by upsetting forging of the sintered body formed by sintering of powder produced by crushing an ingot of an alloy material, it should be possible to enhance the mechanical strength of a thermoelectric semiconductor material. However, the size of the powder particles determine the diameter of the crystal grains in the powder of the ingot, and there is a limit to the miniaturization of the crystal grains. Therefore, the thermoelectric semiconductor material is disadvantageous in reducing thermal conductivity ($\kappa$) and the thermoelectric performance cannot be significantly enhanced. In addition, since the powder is sintered in a state in which each powder particles are randomly oriented, by the plastic deformation of the sintered body having such disordered crystalline orientation, it is difficult to enhance the crystalline orientation of a texture of thermoelectric semiconductor material.

Furthermore, in the technique disclosed in Patent Document 11, electric conductivity ($\sigma$) is increased by heat treatment or sintering in order to remove defects within the grains, and thermal conductivity ($\kappa$) is reduced due to scattering of phonons of the crystal grain boundaries. However, the grain boundaries inevitably exist in a polycrystalline body. Therefore, at present, it is difficult to increase electric conductivity and to reduce thermal conductivity at the same time. In addition, there is a problem in that the electric resistance is lowered in the vicinity of grain boundaries where the impurities are concentrated, whereas inside of the grains which mainly make up the volume are converted to semiconductors, and thus, electric resistance increases.

As a rotational speed of the rotational roll for manufacturing a raw thermoelectric semiconductor material in foil or powder form, Patent Document 12 discloses that the circumferential velocity of a rotational roll may be set at 2 to 80 m/sec. However, Patent Document 12 does not show any concrete processes for manufacturing a thermoelectric semiconductor material by solidifying and forming a raw thermoelectric semiconductor material in foil or powder form that has been manufactured by using a rotational roll of which the circumferential velocity has been set as described above.

As a heating condition for sintering a raw thermoelectric semiconductor material that has been manufactured by a liquid quenching method, Patent Document 13 discloses that the temperature may be set in a range from 200 to 600° C. This is the setting of a temperature condition that allows sintering without losing uniformity in the orientation of the crystals within the texture of the raw thermoelectric semiconductor material, but is totally different from the temperature range for the setting of the temperature when a raw thermoelectric semiconductor material is solidified and formed according to the present invention as described below where segregation, dropping of separated phase, liquid deposition, and the like of a Te rich phase having a low melting point are completely prevented during solidification forming of a raw thermoelectric semiconductor material.

By a technique, as proposed in Patent Document 14, for dispersing Ag in the crystal grain boundaries and lowering resistivity ($\rho$), and thereby, achieving an increase in the thermoelectric performance, Ag serves as a dopant in a (Bi—Sb)$_2$(Te—Se)$_3$ based thermoelectric semiconductor. Therefore, the technique includes a problem in that the added amount of Ag must be strictly adjusted, and also includes a problem of age deterioration.

In the technique described in Patent Document 15, raw thermoelectric semiconductor materials in foil forms manufactured by the rotational rolling method are layered in the direction of the film thickness and are solidified and formed. Therefore, there is a problem in which the crystal orientation of the layered raw thermoelectric semiconductor material is disordered when pressure is applied in the direction parallel to the direction of the film thickness.

When raw thermoelectric semiconductor materials in foil forms manufactured by a rotational rolling method are layered, and pressure is applied to the layered body in the direction perpendicular to the layering direction, and pressure is applied to layered body, as described in Patent Document 16, in a direction perpendicular to the layering direction, or as described in Patent Document 17, in at least three direction perpendicular to the layering direction, it should be possible to improve crystal orientation of the texture. In these case, an improvement of crystalline orientation is achieved by making the direction of C face of the hexagonal structure stand in the layering direction of the raw thermoelectric semiconductor material. However, the direction of c-axis of the hexagonal structure in each crystal grain cannot be uniformly oriented. Therefore the direction of c-axis of the hexagonal structure of the crystal grains cannot be uniformly oriented even when an extrusion molding is additionally and sequentially carried out by applying pressure in the layering direction, as described in Patent Document 17.

In conventional manufacturing methods for a polycrystalline thermoelectric semiconductor materials as described in Patent Documents 2 to 17, powders of ingots to be solidified and formed for the manufacture of a thermoelectric semiconductor material, and raw thermoelectric semiconductor materials in ribbon, foil, and powder form produced by a liquid quenching method have fine grain sizes. Therefore raw thermoelectric semiconductor materials have large specific surface area and their surfaces are easily oxidized. In addition, even when reduction process is carried out on each of the raw materials in order to prevent the surface oxidation, there are many operations to be added such as sealing a material in a mold without allowing contact with oxygen during sintering. Even when such additional operations are carried out, it is difficult to reduce influence of oxidization.

In addition, since each of the above-described raw materials has fine grain size, it is difficult to increase density of the material during sintering. For example, when a raw thermoelectric semiconductor material in fine foil form that has been manufactured by a rotational rolling method and is sintered at 475° C., the increase of density is only within a range of 98 to 99%. When a powder is sintered, reduction of density depends on the grain size, but is limited to approximately 95%. Therefore, there is a possibility that the electric conductivity being lowered.

Furthermore, in a general hot pressing, a fine powder is used in order to obtain the compact texture after sintering. It is known that bulk density increase with decreasing particle size of powder due to increasing amount of air, but it is possible to gain a compact structure by applying pressure. Therefore, in the techniques described in Patent Documents 15 to 17, in which raw thermoelectric semiconductor materials in foil forms manufactured by rotational rolling methods are layered and subsequently solidified and formed, fine foils are used as the raw thermoelectric semiconductor materials. However, since the densification of sintered texture by hot press is a phenomena occurring as a result of powder flow and plastic deformation of powder particles, when fine foils of raw thermoelectric semiconductor materials are solidified, as described in Patent Documents 15 to 17, a large portion of each raw thermoelectric semiconductor material is plastically deformed and in a great number of portions, the original crystalline orientation of the foil is disordered, and an orientation of C face is easily disordered.

DISCLOSURE OF INVENTION

Therefore, an object of the present invention is to provide a thermoelectric semiconductor material having excellent crystalline orientation in the texture, reduced oxygen concentration, and enhanced thermoelectric performance, as well as to provide a thermoelectric semiconductor element using such a thermoelectric semiconductor material, a thermoelectric module using such a thermoelectric element, and manufacturing methods for same.

In order to achieve the above-described objects, the present invention provides a thermoelectric semiconductor material which is produced by: layering and packing raw thermoelectric semiconductor materials made of a raw alloy having a predetermined composition of a thermoelectric semiconductor to form a layered body; solidifying and forming the layered body to form a compact; applying pressure to the compact in a uniaxial direction that is perpendicular or nearly perpendicular to the main layering direction of the raw thermoelectric semiconductor materials; and thereby applying shear force in a uniaxial direction that is approximately parallel to the main layering direction of the raw thermoelectric semiconductor materials, and plastically deforming the compact.

When a raw alloys is contacted with the surface of a cooling member at the time of the manufacture of the thermoelectric semiconductor material, a raw thermoelectric semiconductor material is achieved, in which C face of the hexagonal structure of the crystal grains are oriented approximately parallel to the direction of the plate thickness. When the raw thermoelectric semiconductor materials are layered in the direction of the plate thickness to form a layered body, and then solidified and formed, the direction of extension of C face of the crystal grains is maintained to be oriented in the layering direction in the compact. Furthermore, when pressure is applied to the compact in such a manner that shear force is applied in a uniaxial direction approximately parallel to the main layering direction of the thermoelectric semiconductor, which is approximately similar to the extending direction of C face of the crystal grains, and thereby the compact is plastically deformed, the crystal grains are flattened along the direction in which shear force is applied, and the extending direction of C face remain to be oriented in the direction of shear force during the plastic deformation. At the same time, the directions of c-axes of the crystal grains are oriented approximately parallel to the direction in which pressure is applied for the plastic deformation. Accordingly, in the texture of achieved thermoelectric semiconductor material, both the extending direction of C face and the direction of c-axis in the hexagonal structure of crystal grains are uniformly oriented, and therefore high thermoelectric performance can be obtained by setting current and heat to be conveyed in the extending direction of C face.

Accordingly, a thermoelectric semiconductor material having an excellent thermoelectric performance can be achieved by a manufacturing method for a thermoelectric semiconductor material comprising: melting a raw alloy having a predetermined composition of thermoelectric semiconductor; subsequently having the molten alloy contacted with a surface of a cooling member and thereby forming plate shaped raw thermoelectric semiconductor materials; layering the plate shaped raw thermoelectric semiconductor materials in a direction approximately parallel to a direction of the plate thickness and solidifying and forming the layered body into a compact; applying pressure to the compact in one of two axial directions which are crossing each other in a plane approximately perpendicular to the main layering direction of the raw thermoelectric semiconductor materials, while preventing deformation of the compact in the other axial direction; and thereby applying shear force in an axial direction approximately parallel to the main layering direction of the raw thermoelectric semiconductor materials, and plastically deforming the compact to form a thermoelectric semiconductor material.

In addition, when a thermoelectric semiconductor material has a compound phase comprising: complex compound semiconductor phase having a predetermined stoichiometric composition of a compound thermoelectric semiconductor; and a Te rich phase in which excess Te is added to the above composition, crystal grain boundaries exist in the thermoelectric semiconductor material, and crystal strain is generated due to the presence of the compound phase of complex compound semiconductor phase and the Te rich phase. By the introduction of crystal strain, thermal conductivity can be lowered, and therefore, the Figure-of-Merit can be increased as a result of the lowering of thermal conductivity.

Furthermore, when a thermoelectric semiconductor material is produced by: adding excess Te to a predetermined stoichiometric composition of a compound thermoelectric semiconductor to form a raw alloy; layering and packing plate shaped raw thermoelectric semiconductor materials made of the raw alloy to form a layered body; solidifying and forming the layered body to form a compact; applying pressure to the compact in an axial direction perpendicular or nearly perpendicular to the main layering direction of the raw thermoelectric semiconductor materials; and thereby applying shear force in an axial direction approximately parallel to the main layering direction of the raw thermoelectric semiconductor materials, and plastically deforming the compact, the thermoelectric semiconductor material is provided with excellent crystalline orientation in which both extending direction of C face and direction of c-axes of the hexagonal structure of the crystal grains are approximately uniformly oriented. In addition, due to the presence of the compound phase of complex compound semiconductor phase and the Te rich phase, thermal conductivity can be lowered, and therefore, the Figure-of-Merit can be further increased.

Accordingly, a manufacturing method for a thermoelectric semiconductor material, in which a raw alloy is controlled to have a composition where an excess Te is added to the predetermined stoichiometric composition of a compound thermoelectric semiconductor can provide a thermoelectric semiconductor having excellent crystalline orientation, a compound phase of complex compound semiconductor phase and the Te rich phase, and a high Figure-of-Merit.

In the above described method, a P type thermoelectric semiconductor material having high thermoelectric performance can be produced by controlling the raw alloy to have a composition in which excess Te is added to a $(Bi—Sb)_2Te_3$ based stoichiometric composition, concretely, by controlling the raw alloy to have a composition in which 0.1 to 5% of excess Te is added to the stoichiometric composition of a compound thermoelectric semiconductor comprising 7 to 10 atomic % of Bi, 30 to 33 atomic % of Sb, and 60 atomic % of Te.

On the other hand, a N type thermoelectric semiconductor material having high thermoelectric performance as described above can be produced by controlling the raw alloy to have a composition in which excess Te is added to a $Bi_2(Te—Se)_3$ based stoichiometric composition, concretely, by controlling the raw alloy to have a composition where 0.01% to 10% of excess Te is added to the stoichiometric composition of a compound thermoelectric semiconductor comprising 40 atomic % of Bi, 50 to 59 atomic % of Te, and 1 to 10 atomic % of Se.

Furthermore, when the solidification forming of the raw thermoelectric semiconductor materials is carried out by applying pressure and by heating to a temperature no less than 380° C. and no higher than 500° C., the thermoelectric semiconductor material can be solidified and formed in a state in which the Te rich phase in the raw thermoelectric semiconductor material is prevented from being converted to liquid phase, or the Te rich liquid phase is controlled to be a small amount. Therefore, a P type or N type thermoelectric semiconductor material can be formed, having a multi phase structure of the P type or N type complex compound semiconductor phase dispersing microscopic Te rich phases including an excess Te in the above semiconductor composition.

Moreover, in the manufacturing method, when a molten alloy of the raw alloy is contacted with the surface of a cooling member to form a plate shaped raw thermoelectric semiconductor material, the cooling rate of the molten alloy during solidification may be controlled to a rate by which 90% or more of the thickness of the plate shaped raw thermoelectric semiconductor material is not quenched. Concretely, a rotational roll may be used as the cooling member, and when the plate shaped raw thermoelectric semiconductor material is formed by supplying the molten alloy of the raw alloy to the surface of such cooling member, the rotational roll may be rotated at a rate at which the thickness of the raw thermoelectric semiconductor material is controlled to be at least no less than 30 μm. By this method, microscopic crystal nuclei are formed on the side of contact surface of the molten raw alloy and the cooling member, and the molten alloy can be slowly solidified so that, from the nuclei, large crystal grains grow in the direction of the thickness, and the raw thermoelectric semiconductor material can be formed to have a thickness of no less than 30 μm. At that time, the crystal grains can be grown in such a manner that C face of the hexagonal structure of the crystals extend in the direction of thickness, approximately throughout the entire thickness of the raw thermoelectric semiconductor material. When the raw alloy is made to have a composition including excess Te, in the $(Bi—Sb)_2Te_3$ based P type complex compound semiconductor phase or in the $Bi_2(Te—Se)_3$ based N type complex compound semiconductor phase, the Te rich phases including excess Te in each of the above compositions can be microscopically dispersed as separated phase without being converted to amorphous phase. Thus, the Te rich phase precipitate as hetero phase or nucreate as hetero phase nuclei within crystal grains or in grain boundaries of the complex compound semiconductor, and thereby a raw thermoelectric semiconductor material having crystal strain can be achieved.

In addition, the raw thermoelectric semiconductor material has a great thickness and a large width as a result of solidification from molten raw alloy under slow cooling rate. Therefore, each raw thermoelectric semiconductor material may have large volume, and therefore may have a small specific surface area compared with a powder or the like of fine sizes. Therefore, the possibility of surface oxidization is reduced, and thereby, lowering of the electric conductivity of the raw thermoelectric semiconductor material can be prevented.

In the above described method, when heating during solidification forming of a raw thermoelectric semiconductor material is performed by multiple step method, the layered raw thermoelectric semiconductor material can be heated in such a manner that the entire body reaches a desired temperature for solidification and formation even when the heating position by the heat source is biased during heating raw thermoelectric semiconductor material for solidification and formation. Therefore, the compact formed through solidification forming of a raw thermoelectric semiconductor material can be made homogeneous throughout the entire body, and therefore, the thermoelectric semiconductor material manufactured by plastic deformation of the compact can be made homogeneous throughout the entire body. In addition, when the raw alloy is controlled to have a composition containing excess Te, the above excess component can be dissolved at the grain boundaries, and thus, the junction at the grain boundaries can be improved.

In addition, when the plastic deformation process comprises one or more omnidirectional hydrostatic pressure process, the occurrence of buckling can be prevented and an uniform deformation rate can be obtained during the plastic deformation of the compact. Therefore, a texture of the thermoelectric semiconductor material formed by the above described plastic deformation can be homogenized.

A thermoelectric semiconductor element may be cut out from the above described thermoelectric semiconductor material having excellent crystalline orientation in which both the extending direction of C face and the direction of c-axis of the hexagonal structure of the crystal grains are uniformly oriented. When the cut surface of thermoelectric semiconductor element include, as a contact surface with an electrode, a plane approximately perpendicular to the uniaxial direction of shear force application during the plastic deformation of compact to form the thermoelectric semiconductor material, it is possible to convey a current or heat in the direction approximately parallel to the extending direction of C face of the crystal grains. Therefore, the thermoelectric performance of the thermoelectric semiconductor element can be enhanced.

Accordingly, by a manufacturing method for a thermoelectric semiconductor element, in which a thermoelectric semiconductor material is cut to form a thermoelectric semiconductor element so that an approximately perpendicular plane to the uniaxial direction of shear force application during the plastic deformation of compact may be used as a contact surface with an electrode, the above described thermoelectric semiconductor element having enhanced thermoelectric performance can be achieved.

A P type thermoelectric element and an N type thermoelectric semiconductor element may be formed as above described thermoelectric semiconductor elements having a high thermoelectric performance. A PN element pair may be formed by joining, via a metal electrode, the P type and N type thermoelectric semiconductor elements arranged so that the elements are aligned in the direction perpendicular to the axial direction of pressure application during plastic deformation of compact for forming a thermoelectric semiconductor material, and also perpendicular to the direction of shear force by the pressure application. A thermoelectric semiconductor module may be made to have the configuration provided by the PN element pair. In such a thermoelectric semiconductor module, a stress caused by expansion or contraction of the metal electrode accompanied with temperature deviation during the use of the thermoelectric module can be applied to each of the P type and N type thermoelectric semiconductor elements in the direction parallel to C face of the hexagonal structure of the respective crystal grains. Therefore, even when the metal electrode expands or contracts, interlayer peeling of the crystals in the texture of the thermoelectric semiconductor elements can be prevented, strength and durability of the thermoelectric module can be enhanced.

Accordingly, the thermoelectric module having enhanced durability and strength can be achieved by a manufacturing method for a thermoelectric module comprising: preparing P type and N type thermoelectric semiconductor elements as above described thermoelectric semiconductor elements; arranging the P type and N type thermoelectric semiconductor elements so that the elements are aligned in the direction perpendicular to the axial direction of pressure application during plastic deformation of a compact, and also perpendicular to the direction of shear force by the pressure application; joining the P type and N type elements via a metal electrode to form a PN element pair.

According to the present invention as described above, excellent effects can be obtained as following:

(1) A thermoelectric semiconductor material is produced by: layering and packing plate shaped raw thermoelectric semiconductor materials made of a raw alloy having a predetermined composition of a thermoelectric semiconductor to form a layered body; solidifying and forming the layered body to form a compact; plastically deforming the compact by applying pressure to the compact in a uniaxial direction that is perpendicular or nearly perpendicular to the main layering direction of the raw thermoelectric semiconductor material, and thereby applying shear force in a uniaxial direction that is approximately parallel to the main layering direction of the raw thermoelectric semiconductor material. In such a thermoelectric semiconductor elements, it is possible to enhance the strength by applying additional pressure to plastically deforming the compact which is formed by solidification forming of plate shaped raw thermoelectric semiconductor materials. At the same time, not only the extending direction of C face, but also the direction of c-axis of the hexagonal structure in the crystal grains in the texture can be uniformly oriented, and highly excellent crystalline orientation can be achieved. Therefore, by setting the direction in which current and heat are conveyed in the extending direction of C face of the crystal grains, thermoelectric performance can be enhanced.

(2) Accordingly, the above described thermoelectric semiconductor material may be achieved by a manufacturing method of a thermoelectric semiconductor material comprising: melting a raw alloy having a predetermined composition of thermoelectric semiconductor; subsequently having the molten alloy contacted with the surface of a cooling member and thereby forming plate shaped raw thermoelectric semiconductor materials; layering the plate shaped raw thermoelectric semiconductor materials in a direction approximately parallel to the direction of the plate thickness to form a layered body; solidifying and forming the layered body to form a compact; applying pressure to the compact in one of two axial directions which are crossing each other in a plane approximately perpendicular to the main layering direction of the raw thermoelectric semiconductor materials, while preventing deformation of the layered body in the other axial direction; and thereby applying shear force in an axial direction approximately parallel to the main layering direction of the raw thermoelectric semiconductor materials, and plastically deforming the layered body to form a thermoelectric semiconductor material.

(3) In a thermoelectric semiconductor material having a compound phase comprising: complex compound semiconductor phase having a predetermined stoichiometric composition of a compound thermoelectric semiconductor; and a Te rich phase in which excess Te is added to the above composition, crystal grain boundaries exist in the thermoelectric semiconductor material, and crystal strain is generated due to the presence of the compound phase of complex compound semiconductor phase and the Te rich phase. By the introduction of crystal strain, thermal conductivity can be lowered, and therefore, the Figure-of-Merit can be increased as a result of the lowering of thermal conductivity.

(4) In a thermoelectric semiconductor material produced by: adding excess Te to the predetermined stoichiometric composition of a compound thermoelectric semiconductor to form a raw alloy; layering and packing plate shaped raw thermoelectric semiconductor materials made of the raw alloy to form a layered body; solidifying and forming the layered body to form a compact; applying pressure to the compact in an axial direction perpendicular or nearly perpendicular to the main layering direction of the raw thermoelectric semiconductor materials; and thereby applying shear force in an axial direction approximately parallel to the main layering direction of the raw thermoelectric semiconductor materials, and plastically deforming the compact, the thermoelectric semiconductor material is provided with excellent crystalline orientation in which both extending direction of C face of the hexagonal structure of the crystal grains and direction of c-axes of the crystal grains are approximately uniformly oriented. In addition, due to the presence of the compound phase of complex compound semiconductor phase and the Te rich phase, thermal conductivity can be lowered, and therefore, the Figure-of-Merit can be further increased.

(5) Accordingly, a thermoelectric semiconductor having above described excellent crystalline orientation, a compound phase of complex compound semiconductor phase and the Te rich phase, and a high Figure-of-Merit can be achieved by a manufacturing method for a thermoelectric semiconductor material, comprising controlling a raw alloy to have a composition in which excess Te is added to the predetermined stoichiometric composition of a compound thermoelectric semiconductor.

(6) In the above described method, a P type thermoelectric semiconductor material having high thermoelectric performance can be produced by controlling the raw alloy to have a composition in which excess Te is added to a $(Bi—Sb)_2Te_3$ based stoichiometric composition, concretely, by controlling the raw alloy to have a composition where 0.1% to 5% of excess Te is added to the stoichiometric composition of a compound thermoelectric semiconductor comprising 7 to 10 atomic % of Bi, 30 to 33 atomic % of Sb, and 60 atomic % of Te.

(7) On the other hand, a N type thermoelectric semiconductor material having above described high thermoelectric performance can be produced by controlling the raw alloy to have a composition where excess Te is added to a $Bi_2(Te—Se)_3$ based stoichiometric composition, concretely, by controlling the raw alloy to have a composition where 0.01% to 10% of excess Te is added to the stoichiometric composition of a compound thermoelectric semiconductor comprising 40 atomic % of Bi, 50 to 59 atomic % of Te, and 1 to 10 atomic % of Se.

(8) Furthermore, by carrying out solidification forming of the raw thermoelectric semiconductor material by applying pressure along with heating the raw material to a temperature no less than 380° C. and no higher than 500° C., the thermoelectric semiconductor material can be solidified and formed in a state in which the Te rich phase in the raw thermoelectric semiconductor material is prevented from being converted to liquid phase, or the Te rich liquid phase is controlled to be a small amount. Therefore, a P type or N type thermoelectric semiconductor material can be formed, having a multi phase structure of the P type or N type complex compound semiconductor phase dispersing microscopic Te rich phases including an excess Te in the above semiconductor composition.

(9) Moreover, in the manufacturing method, when a molten alloy of the raw alloy is contacted with the surface of a cooling member to form a plate shaped raw thermoelectric semiconductor material, the cooling rate of the molten alloy during solidification may be controlled to a rate at which 90% or more of the thickness of the plate shaped raw thermoelectric semiconductor material is not quenched. Concretely, a rotational roll may be used as the cooling member, and when the plate shaped raw thermoelectric semiconductor material is formed by supplying the molten alloy of the raw alloy to the surface of such cooling member, the rotational roll may be rotated at a rate at which the thickness of the raw thermoelectric semiconductor material is controlled to be at least no less than 30 μm. By this method, microscopic crystal nuclei are formed on the side of contact surface of the molten raw alloy and the cooling member, and the molten alloy can be slowly solidified so that, from the nuclei, large crystal grains grow in the direction of the thickness, and the raw thermoelectric semiconductor material can be formed to have a thickness of no less than 30 μm. At that time, the crystal grains can be grown in such a manner that C face of the hexagonal structure of the crystals extend in the direction of thickness, approximately throughout the entire thickness of the raw thermoelectric semiconductor material. When the raw alloy is made to have a composition including excess Te, in the $(Bi—Sb)_2Te_3$ based P type complex compound semiconductor phase or in the $Bi_2(Te—Se)_3$ based N type complex compound semiconductor phase, the Te rich phases including an excess Te in each of the above compositions can be microscopically dispersed as separated phase without being converted to amorphous phase. Thus, a Te rich phase precipitate as hetero phase or nucleate as hetero phase nuclei within crystal grains or in grain boundaries of the complex compound semiconductor, and thereby a raw thermoelectric semiconductor material having crystal strain can be achieved.

In addition, the raw thermoelectric semiconductor material has a large thickness and a large width as a result of solidification from molten raw alloy under slow cooling rate. Therefore, each raw thermoelectric semiconductor material may have large volume, and therefore may have a small specific surface area compared with a powder or the like of fine sizes. Therefore, the possibility of surface oxidization is reduced, and thereby, lowering of the electric conductivity of the raw thermoelectric semiconductor material can be prevented.

(10) In the above described method, when heating during solidification and forming process of a raw thermoelectric semiconductor material is performed by multiple step method, the layered raw thermoelectric semiconductor material can be heated in such a manner that the entire body reaches a desired temperature for solidification forming even when the heating position by the heat source is biased during heating raw thermoelectric semiconductor material for solidification forming. Therefore, the compact formed through solidification forming of a raw thermoelectric semiconductor material can be made homogeneous throughout the entire body, and therefore, the thermoelectric semiconductor material manufactured by plastic deformation of the compact can be made homogeneous throughout the entire body. In addition, when the raw alloy is controlled to have a composition containing excess Te, the above excess component can be dissolved at the grain boundaries, and thus, the junction at the grain boundaries can be improved.

(11) In addition, when the plastic working process in the method comprises one or more omnidirectional hydrostatic pressure process, the occurrence of buckling can be prevented and an uniform deformation rate can be obtained during the plastic deformation of the compact. Therefore, a texture of the thermoelectric semiconductor material formed by the above described plastic deformation can be homogenized.

(12) A thermoelectric semiconductor element may be cut out from the above described thermoelectric semiconductor material having excellent crystalline orientation in which both the extending direction of C face and the direction of c-axis of the hexagonal structure of the crystal grains are uniformly oriented. When the cut surface of thermoelectric semiconductor element include, as a contact surface with an electrode, a plane approximately perpendicular to the uniaxial direction of shear force application during the plastic deformation of a compact to form the thermoelectric semiconductor material, it is possible to convey a current or heat in the direction approximately parallel to the extending direction of C face of the crystal grains. Therefore, the thermoelectric performance of the thermoelectric semiconductor element can be enhanced.

(13) Accordingly, the above described thermoelectric semiconductor element having enhanced thermoelectric performance can be achieved by a manufacturing method for a thermoelectric semiconductor element, comprising slicing a thermoelectric semiconductor material to form a thermoelectric semiconductor element so that an approximately perpendicular plane to the uniaxial direction of shear force application during the plastic deformation of a compact may be used as a contact surface with an electrode.

(14) A P type thermoelectric element and an N type thermoelectric semiconductor element may be formed as above described thermoelectric semiconductor elements having a high thermoelectric performance. A PN element pair may be formed by joining, via a metal electrode, the P type and N type thermoelectric semiconductor elements arranged so that the elements are aligned in the direction perpendicular to the axial direction of pressure application during plastic deformation of a compact for forming a thermoelectric semiconductor material, and also perpendicular to the direction of shear force by the pressure application. A thermoelectric semiconductor module may be made to have the configuration provided by the above described PN element pair. In such a thermoelectric semiconductor module, a stress caused by expansion or contraction of the metal electrode accompanied with temperature deviation during the use of the thermoelectric module can be applied to each of the P type and N type thermoelectric semiconductor elements in the direction parallel to C face of the hexagonal structure of the respective crystal grains. Therefore, even when the metal electrode expands or contracts, interlayer peeling of the crystals in the texture of the thermoelectric semiconductor elements can be prevented, strength and durability of the thermoelectric module can be enhanced.

(15) Accordingly, the thermoelectric module having enhanced durability and strength can be achieved by a manufacturing method for a thermoelectric module comprising: preparing P type and N type thermoelectric semiconductor elements as above described thermoelectric semiconductor elements; arranging the P type and N type thermoelectric semiconductor elements so that the elements are aligned in the direction perpendicular to the axial direction of pressure application during plastic deformation of a compact, and also perpendicular to the direction of shear force by the pressure application; joining the P type and N type elements via a metal electrode to form a PN element pair.

BRIEF DESCRIPTION OF THE DRAWINGS

FIG. 8A is a diagram showing a plastic working device used in the plastically deforming process of FIG. 1 and is a schematic cross sectional side view of the device in the initial state before plastically deforming the compact.

FIG. 8B is a diagram showing the device of FIG. 8A as viewed along the line A-A in the direction of the arrows;

FIG. 8C is a diagram showing a plastic working device used in the plastically deforming process of FIG. 1 and is a schematic cross sectional side view of the device in a state in which a thermoelectric semiconductor material is formed by plastic deformation of a compact.

FIG. 8D is a diagram corresponding to FIG. 8B showing another type of the plastic working device used in the plastically deforming process of FIG. 1 and is provided with a ring for fixing the position.

BEST MODE FOR CARRYING OUT THE INVENTION

In the following embodiments of the present invention are explained with reference to the drawings.

Figure 1:
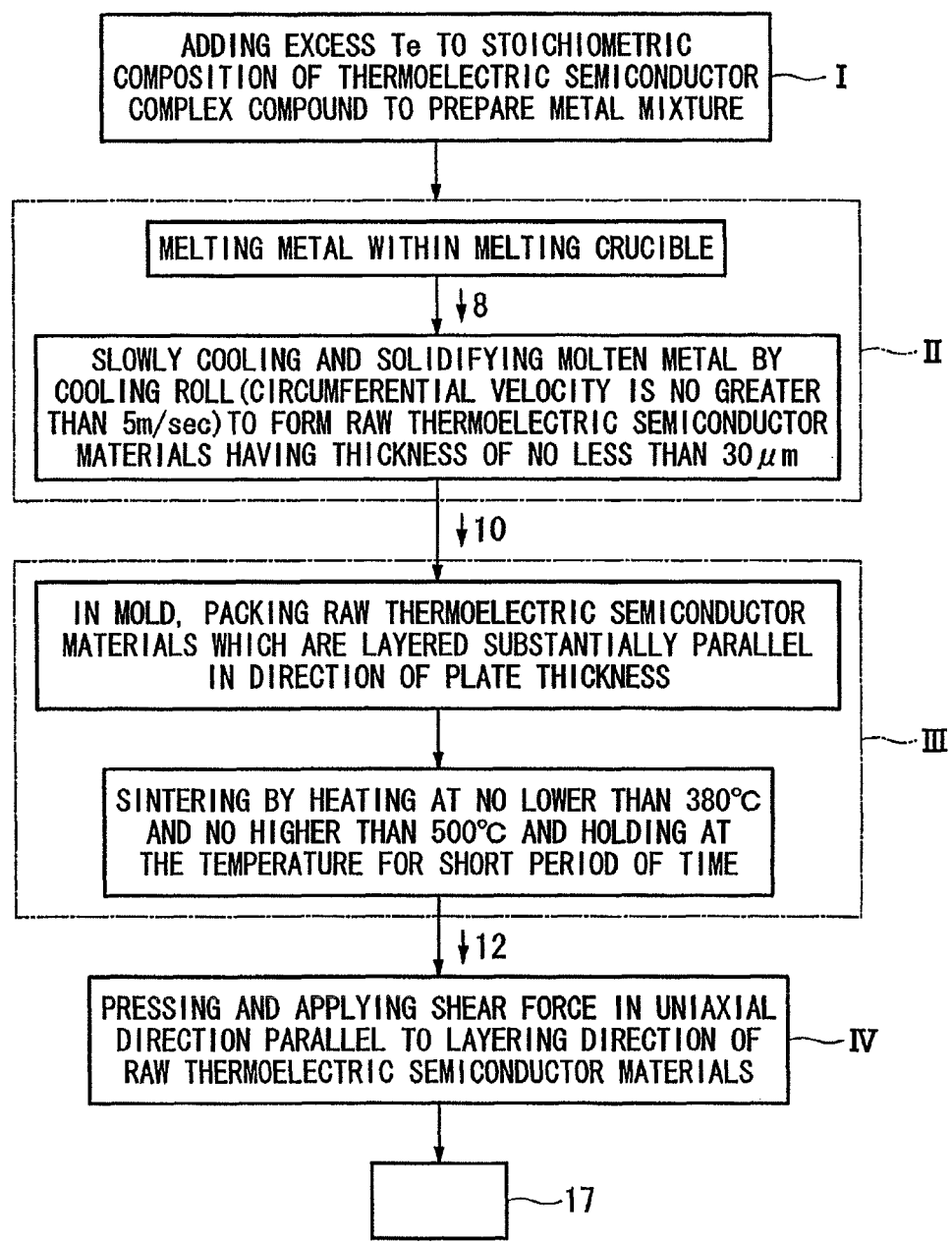
FIG. 1 is a flow chart showing an embodiment of manufacturing method for a thermoelectric semiconductor material according to the present invention.

FIGS. 1 to 18 show an embodiment of manufacturing method for a thermoelectric semiconductor material according to the present invention. As shown in the flow chart of FIG. 1, basically the thermoelectric semiconductor material is manufactured by: preparing an alloy by mixing, in a predetermined ratio, respective metals composing a raw alloy of a thermoelectric semiconductor; melting the metals to form a molten alloy; slowly cooling the molten alloy by an undermentioned cooling method at a rate at which 90% or more of the thickness of the raw thermoelectric semiconductor material is not quenched; solidifying the molten alloy to form a thin plate shaped foils (slow cooling foils) as raw thermoelectric semiconductor materials; after layering and packing the slow cooling foils produced as raw thermoelectric semiconductor materials so that the foils are layered in a mold, in the direction of plate thickness, solidification forming the layered foils under an undermentioned predetermined heating condition to form a compact; next, plastically deforming the compact by applying a load in such a manner that a shear stress is applied in an uniaxial direction approximately parallel to the main layering direction of the raw thermoelectric semiconductor material, and thereby manufacturing a thermoelectric semiconductor material.

Concrete manufacturing methods for an N type thermoelectric semiconductor material and an N type semiconductor element are described as follows.

Firstly, to prepare a stoichiometric composition of a raw alloy of an N type thermoelectric semiconductor in a component mixing process I, Bi, Se and Te are weighed so that the raw alloy contains 40 atomic % of Bi, 1 to 10 atomic % of Se, and 50 to 59 atomic % of Te. The weighed metals are mixed to obtain a $Bi_2(Te-Se)_3$ based composition. Furthermore excess Te is aided so that 0.01 to 10% by weight of Te is contained in the entire $Bi_2(Te-Se)_3$ based component, and thus an alloy having a nonstoichiometric composition with excess Te is prepared. At that time, a predetermined amount of dopant for forming an N type thermoelectric semiconductor, such as Hg, Ag, Cu or a halogen dopant, may be added.

Figure 2:
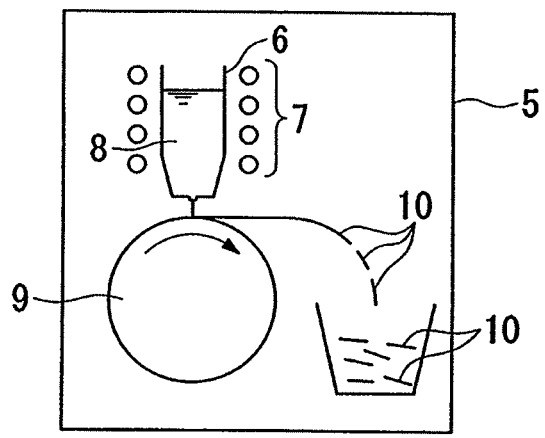
FIG. 2 is a diagram schematically showing a device used in the slow cooling foil manufacturing process of FIG. 1.

Next, in a slow cooling foil manufacturing process II, as shown in FIG. 2, a metal mixture that has been mixed and prepared in the above-described component mixing process I is put into a melting crucible 6 made of quartz. The crucible is introduced into a container 5 which can hold a low oxygen concentration atmosphere such as a reduction gas atmosphere, an inert gas atmosphere or a vacuum. The crucible is heated by a heating coil 7 so as to melt the metal to form a molten alloy 8. After that, the molten alloy 8 is supplied to the surface of a rotational roll 9 such as a water cooled roll. The rotational roll act as cooling member and the molten alloy is solidified. So as to form slow cooling foils as raw thermoelectric semiconductor materials 10 of at least 30 μm or more in thickness, the molten alloy is supplied from a nozzle which has a predetermined diameter, for example 0.5 mm, and is provided at the bottom of the melting crucible 6, to the surface of the rotational roll 9 rotating at a slow rate at which the circumference velocity is no higher than 5 m/sec, and thereby the molten alloy is solidified. By this process, slow cooling foils as raw thermoelectric semiconductor materials 10 in thin plate shaped forms are manufactured as shown in FIG. 3.

It is preferable to set the rotational velocity of the rotational roll 9 so that the circumferential velocity is no higher than 2 m/sec. When the circumference velocity of the rotational roll 9 is set to be no higher than 5 m/sec, as it is obviously shown in the graph of FIG. 4, the thickness of the slow cooling foil manufactured as a raw thermoelectric semiconductor material 10 can be made as thick as 30 μm or more. In addition, when molten alloy 8 is solidified on the surface of the rotational roll 9 to form the raw thermoelectric semiconductor material 10, the molten alloy can be solidified at a rate by which 90% or more of the thickness of the raw thermoelectric semiconductor material is not quenched. Therefore, as shown in FIG. 3, crystal grains 11 formed in the texture of the raw thermoelectric semiconductor material 10 may have a length extending throughout entire thickness of the slow cooling foil as the raw thermoelectric semiconductor material 10, and thus, raw thermoelectric semiconductor material 10 having an excellent crystalline orientation can be formed. Furthermore, when the circumferential velocity of rotational roll 9 is set to be no greater than 2 m/sec, the thickness of raw thermoelectric semiconductor material 10 can be effectively increased to a value of no less than approximately 70 μm. Thus lengths of crystal grains 11 can be additionally increased, and the crystalline orientation can be further improved. In addition, as described above, when the rotational speed of rotational roll 9 is set so that the circumferential velocity becomes no greater than 5 m/sec, as it is obvious from the graph shown in FIG. 5, the width of the slow cooling foils manufactured as the raw thermoelectric semiconductor materials 10 can be increased, and the volumes of each raw thermoelectric semiconductor material 10 can be increased.

Figure 3:
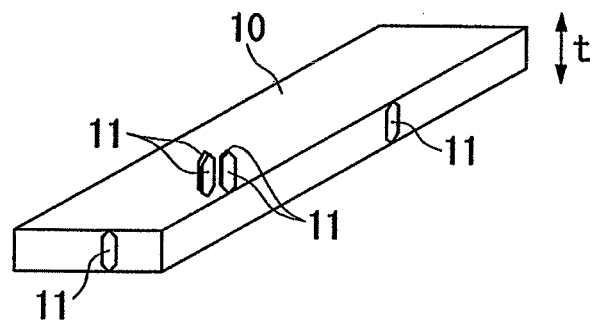
FIG. 3 is a schematic perspective diagram showing a raw thermoelectric semiconductor material formed in the slow cooling foil manufacturing process of FIG. 1.

Crystal grains 11 in the texture of raw thermoelectric semiconductor material 10 are schematically illustrated as hexagons in FIG. 3. These hexagons do not show the actual crystal lattice in the hexagonal structure of the above-described crystal grains 11, but for convenience in explanation, schematically show the direction of C face of the hexagonal structure of the crystal grains 11 by the hexagons, and in addition, by the flattened direction of the hexagons, schematically indicate the direction in which crystal grains 11 are flattened, that is, the direction in which the crystal grains are oriented. This can be applied to the following figures.

As a result of this, molten alloy 8 of the raw alloy is supplied to the rotational roll 9 and is slowly cooled, and thereby is slowly and sequentially cooled from the contact surface with the rotational roll toward the outer periphery of the roll, that is in the direction of the thickness of molten alloy 8. As a result, as shown in FIG. 3, the crystal structures of the complex compound semiconductor phases of $Bi_2Te_3$ and $Bi_2Se_3$ are respectively solidified and crystallized, in which extending direction of C face of the hexagonal structure of crystal grains 11 are mainly oriented in the direction of the plate thickness (the direction shown by arrow t in the figure). At the same time, since Te is added to the above molten alloy 8 so that excess Te is added to the $Bi_2(Te-Se)_3$ based stoichiometric composition, Te rich phases including excess Te in the composition of $Bi_2Te_3$ or $Bi_2Se_3$ are microscopically dispersed as a non-amorphous separated phase in the crystal grains and grain boundaries of the respective complex compound semiconductor phases of $Bi_2Te_3$ and $Bi_2Se_3$. Thus a raw thermoelectric semiconductor material 10 that is thought to have a structure dispersing microscopic Te-rich phase, that is, a structure having crystal strain by precipitation of hetero phase (Te-rich phase) or by nucleation of hetero phase nuclei within crystal grains and grain boundaries of the $Bi_2(Te-Se)_3$ based complex compound semiconductor, can be achieved.

Figure 6A:
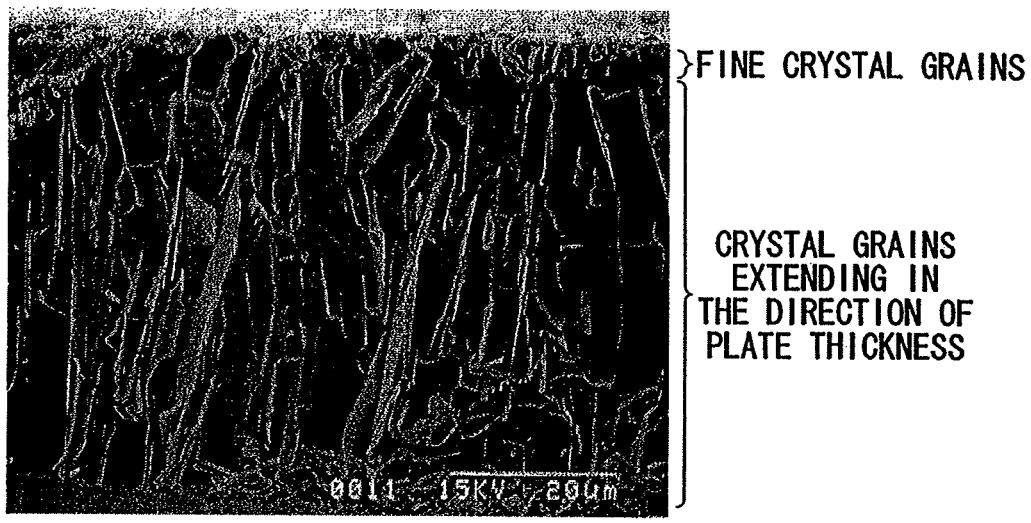
FIG. 6A is a photograph showing the cross section of the structure of a raw thermoelectric semiconductor material formed in the slow cooling foil manufacturing process of FIG. 1.
Figure 6B:
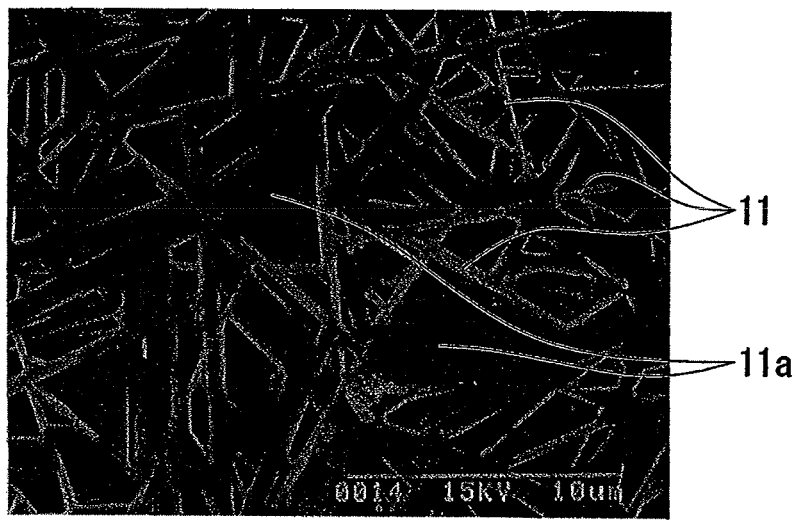
FIG. 6B is a photograph of the structure of a raw thermoelectric semiconductor material formed in the slow cooling foil manufacturing process of FIG. 1 showing a surface of the raw thermoelectric semiconductor material opposite to the contact surface with a rotational roll.

FIGS. 6A and 6B show scanning electron microscope (SEM) images of a texture of raw thermoelectric semiconductor material 10 manufactured by the above-described slow cooling foil manufacturing process II. FIG. 6A shows a cross section of the raw thermoelectric semiconductor material 10. In this figure, contact surface with the rotational roll 9 is placed on the upper side. FIG. 6B shows the surface structure of the raw thermoelectric semiconductor material 10 opposite to the contact surface with the rotational roll.

As is clear from the FIG. 6A, raw thermoelectric semiconductor materials 10 having a thickness of no less than 30 μm can be formed in the slow cooling foil manufacturing process II. The contact surface with the rotational roll 9 shows fine crystal grains formed by quenching of molten alloy 8 by the contact with the rotational roll 9. These fine crystal grains are formed only in the surface region on the side of the contact surface with the rotational roll 9, whereas other than the surface region having the fine crystal grains, in the region of 90% or more of the thickness, large crystal grains 11 oriented in the direction of the plate thickness throughout the entire thickness of the plate can be formed.

In addition, as is clear from FIG. 6B, the raw thermoelectric semiconductor material 10 have a textual structure in which crystal grains 11a of hetero phases (Te rich phases) are generated within the grains and grain boundaries of crystal grains 11 of the $Bi_2(Te-Se)_3$ based complex compound semiconductor or the like, which are flattened and oriented so as to extend in direction of the plate thickness.

Powder particles of small grain sizes mixed in the raw thermoelectric semiconductor materials 10 manufactured by the slow cooling foil manufacturing process II may be removed in advance by sieving, before the raw thermoelectric semiconductor materials being sent to the following solidification forming process III.

Figure 7A:
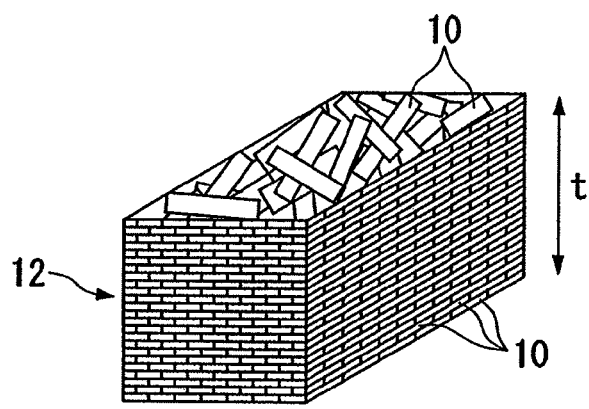
FIG. 7A is a schematic perspective diagram showing a compact formed in the solidification forming process of FIG. 1.

Next, in the solidification forming process III, the slow cooling foils of raw thermoelectric semiconductor materials 10 manufactured by the slow cooling foil manufacturing process II are layered in the direction approximately parallel to the direction of the plate thickness (the direction of arrow t) and are packed in a mold, not shown, within a container (not shown) that can hold a low oxygen concentration atmosphere such as a reduction gas atmosphere, an inert gas atmosphere or a vacuum of 10 Pa or less. After that, the foils are sintered and pressurized and are solidified and formed to have a predetermined form. For example, a rectangular solid shaped compact 12 having a predetermined width corresponding to a spacing between restricting members 15 in a plastic working device 13 used in the after-mentioned plastically deforming process IV is manufactured as shown in FIGS. 7A, 7B, and 7C.

Figure 7B:
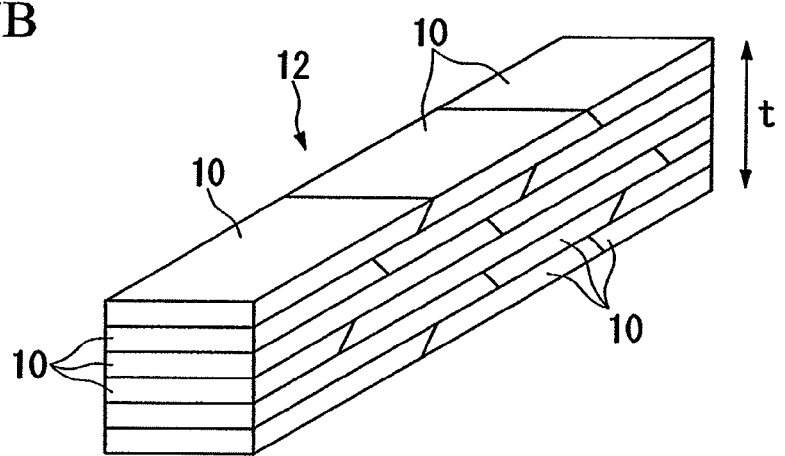
FIG. 7B is a perspective diagram of a compact formed in a solidification forming process of FIG. 1 schematically showing the layered structure of a raw thermoelectric semiconductor material.
Figure 7C:
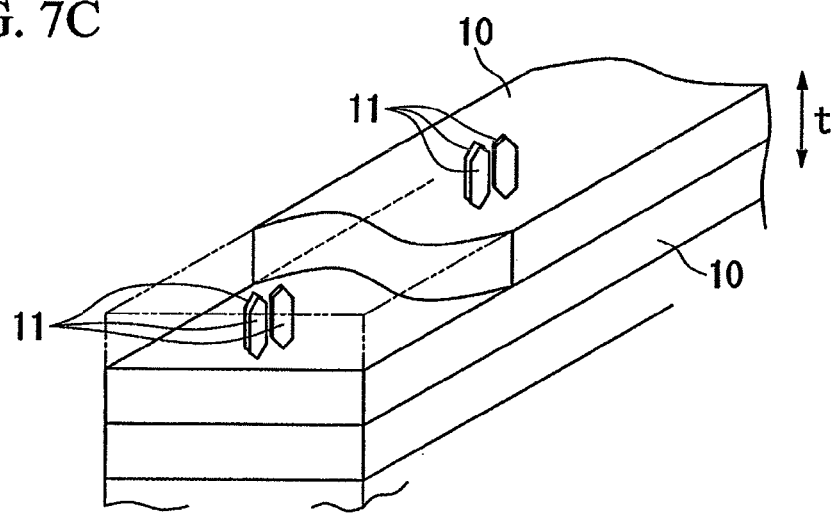
FIG. 7C is an enlarged perspective diagram showing a partial cross section of a compact shown in FIG. 7B.

FIG. 7B schematically shows a layered structure of the slow cooling foils of a raw thermoelectric semiconductor material 10 as a basic configuration of the structure of the compact 12. FIG. 7C shows an enlarged view of the layered structure of raw thermoelectric semiconductor materials 10 of the FIG. 7B.

As conditions for the above-described sintering process, along with applying predetermined pressure, for example, pressure of no less than 14.7 MPa, and heat is applied in a manner such that the Te rich phase existing in the thermoelectric semiconductor material manufactured in the above-described slow cooling foil manufacturing process II is prevented from complete segregation, formation of deferent phase, or liquid phase precipitation. Since the Te-rich phase have a possibility to form a liquid phase at a temperature of approximately 420° C., sintering is carried out by heating to a temperature condition of no higher than 500° C., preferably no lower than 420° C. and no higher than 450° C., and keeping at the temperature for about 5 seconds to 5 minutes.

The lower limit of the temperature condition in the sintering is no lower than 380° C. This is because the density of compact 12 does not increase when the sintering temperature is lower than 380° C.

At the time of the above-described sintering, multi step heating is carried out so that the entirety of the object for sintering can be approximately uniformly heated to the predetermined sintering temperature without causing heterogeneous temperature distribution in the object.

In the multi step heating, when an object for sintering is heated to the predetermined sintering temperature using a predetermined heating source, not shown, heating step is controlled to comprise one or more periods, for example, for no less than 10 seconds, of stopping heating by the heat source for a predetermined period of time, or of temporally changing the heating by the heat source so that the heating rate of the object of sintering is slowed down, and thereby homogenizing the temperature of the whole object for sintering by heat conduction during the above-described stopping heating or slowing heating rate periods. After homogenizing the temperature of the whole body in the process of heating, by further heating the object for sintering, the object is heated almost homogeneously to the final temperature, as the sintering temperature.

Accordingly, by homogenizing the temperature of the entire object for sintering in the process of heating, even though the heating position by the heat source is biased, uneven temperature distribution can be restrained when the temperature reaches the sintering temperature. In this case, as a heating device (heating furnace) for the sintering, conventional hot pressing, energized hot pressing or pulse energized hot pressing may be used. In addition, the above-described periods for stopping heating, or slowing the heating rate are not limited to 10 seconds or higher, but may be arbitrarily set depending on the heating ability of the heat source, the size of the object for sintering, or the like.

The slow cooling foils as raw thermoelectric semiconductor materials 10 formed in the above-described slow cooling foil manufacturing process II have large widths and thicknesses, and therefore, their layered body have a large volume and many interstices. By layering and subsequently sintering along with pressurizing the raw thermoelectric semiconductor materials 10 in the solidification forming process III, atoms of the respective raw thermoelectric semiconductor materials 10 migrate so as to fill in the interstices between the raw thermoelectric semiconductor materials 10. Together with the migration of atoms, the respective raw thermoelectric semiconductor materials 10 are plastically deformed so as to make contact with each other and fill in the interstices between the raw thermoelectric semiconductor materials 10. Therefore, raw thermoelectric semiconductor materials 10 which are made to make contact with each other through the plastic deformation are joined to each other via the interfaces.

At that time, although the deformation of raw thermoelectric semiconductor materials 10 slightly disarrange the orientation of C face of crystal grains 11 that have been oriented approximately in the direction of plate thickness of the raw thermoelectric semiconductor material 10, that disordering does not cause a volumetric breakdown of the whole body. Accordingly, as shown in FIG. 7B, in the slow cooling foils of raw thermoelectric semiconductor material 10 constructing the compact 12, the orientation of crystal grains 11 is maintained as same as the crystalline orientation (in the direction of arrow t) of a single piece of raw thermoelectric semiconductor material 10 shown in FIG. 3. Therefore, it is possible to prevent the possibility of mass breakdown of the orientation of C face of the crystal grains, which could not be avoided in prior art, in which very fine raw thermoelectric semiconductor materials were sintered.

In addition, in the formation of the compact 12, slow cooling foils of raw thermoelectric semiconductor material 10 having a large thickness and large width are layered in the direction approximately parallel to the direction of the plate thickness, and subsequently solidified and formed. Therefore, the interstices between the raw thermoelectric semiconductor materials 10 can be easily reduced, and it becomes possible to increase density of the compact 12 to approximately 99.8% or higher of the density of an ideal crystal structure of the complex compound semiconductor of the same composition.

Furthermore, no or only little amount of Te rich phase in the raw thermoelectric semiconductor material 10 is converted to a liquid phase during sintering. Therefore, the compact 12 is formed so as to maintain the textual structure of a complex compound semiconductor phase having the composition of $Bi_2Te_3$ and $Bi_2Se_3$ dispersing microscopic Te rich phases including excess Te in the above-described compositions. In addition, together with heating during the sintering process, the Te rich phases partially occur in the interfaces between the slow cooling foils as raw thermoelectric semiconductor materials 10.

After that, in the plastically deforming process IV, a plastic working device 13 is prepared to comprise an air-tight container, not shown, that can hold a low oxygen concentration atmosphere, for example, having partial pressure of oxygen no higher than 0.2 Pa by a reduction gas atmosphere, an inert gas atmosphere or a vacuum. In such a container, as shown in FIGS. 8A, 8B, and 8C, a pair of restricting members 15 in plate form having approximately parallel surfaces opposed to each other are placed intervening a predetermined spacing at either side of a base 14. The spacing corresponds to the width of the above-described compact 12 (dimension of the compact 12 in one axial direction of the two axial directions crossing in a plane perpendicular to the main layering direction of raw thermoelectric semiconductor materials 10 forming the compact 12). Inner side of the restricting members 15 placed in the lateral direction, a punch 16 is placed so that it can slide in the upward and downward directions. In addition, by a vertical driving unit, not shown, along with being added with a load, the punch 16 can be lowered from the upper position above the restricting members 15 placed in the lateral direction to the lower position inside between the restricting members 15. Heating units are provided to predetermined positions of the base 14, restricting members 15, and punch 16. As shown in FIG. 8A, in a state where the punch 16 is pulled up to the upper position above the restricting members 15, the compact 12 formed in the solidification forming process III is placed in the center portion between the restricting members 15 so that the longitudinal direction of this compact 12 is vertically directed. At the same time, the compact 12 is arranged so that the layering direction of the raw thermoelectric semiconductor materials 10 forming the compact 12 (direction of arrow t, same as the direction of the plate thickness of the raw thermoelectric semiconductor material 10) is set to be parallel to the restricting members 15 placed in the lateral direction, and both sides of the compact in the direction of the width are placed so as to make contact with the inner surfaces of the restricting members 15 placed in the lateral direction. Next, along with heating the compact 12 at a temperature that is no higher than 470° C., preferably no higher than 450° C. by the heating units, pressure of a predetermined load is applied to the compact 12 by lowering the punch 16 by the vertical driving unit as shown in two-dot chain lines of FIG. 8A. As a result, as shown in FIG. 8C, the compact 12 is plastically deformed so as to be expanded in a uniaxial direction parallel to the layering direction of raw thermoelectric semiconductor materials 10, and a thermoelectric semiconductor material 17 of rectangular solid is manufactured.

In the above-described plastic working device 13, when a pressing force is applied from above to compact 12 by punch 16, since deformation of the compact 12 in the direction of its width is restricted by the restricting members 15 placed in the lateral direction, deformation of the compact 12 is allowed only in the direction parallel to the restricting members 15, that is to say, in the layering direction of raw thermoelectric semiconductor materials 10 (in the direction of arrows t), and therefore a shear force is applied in a uniaxial direction parallel to the layering direction. As a result, in the slow cooling foils of raw thermoelectric semiconductor material 10 constructing the compact 12 before the above-described plastic deformation, interfaces of layers are deformed and adjacent layers are integrated to each other. Crystal grains being oriented so that C face of the hexagonal structure extend in the direction parallel to the direction of the plate thickness of raw thermoelectric semiconductor materials 10 in the compact 12, are plastically deformed to be flattened in the direction in which the shear force is applied, and are oriented so that the cleavage planes are perpendicular to the direction of the pressure.

Figure 9A:
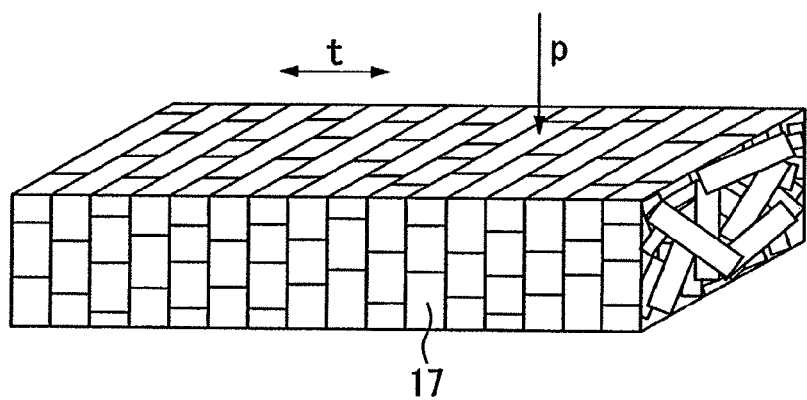
FIG. 9A is a schematic perspective diagram showing a thermoelectric semiconductor material formed in the plastically deforming process of FIG. 1.
Figure 9B:
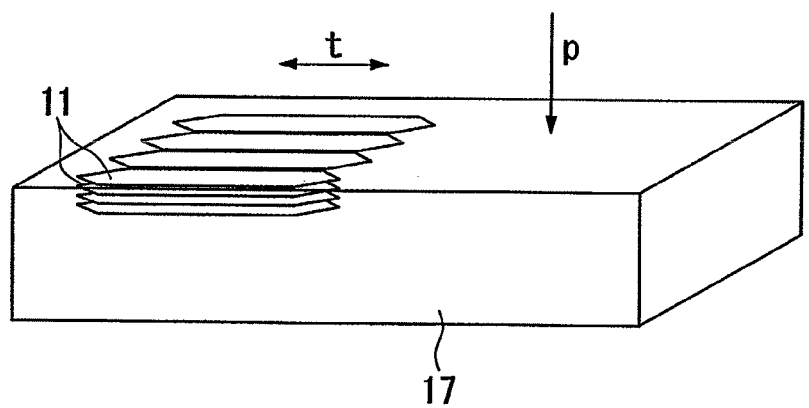
FIG. 9B is a perspective diagram schematically showing the crystalline orientation of a thermoelectric semiconductor material formed in the plastically deforming process of FIG. 1.

Accordingly, as shown in FIG. 9A, in the texture of thermoelectric semiconductor material 17 formed after the plastically deforming of the compact 12, crystal grains are oriented as schematically shown in FIG. 9B. The crystal grains 11 are respectively deformed so that C face of the hexagonal structure extends in the expanding direction of the compact 12, that is to say, in the direction parallel to the layering direction of raw thermoelectric semiconductor materials 10 in the compact 12 before the deformation (in the direction of arrows t). At the same time, most of the crystal grains 11 are oriented so that the direction of c-axes are aligned in the direction of compression (in the direction of arrows p) in the plastically forming process. The hexagons in FIG. 9B only indicate the orientation of the crystal grains 11, but do not reflect the actual sizes of the crystal grains 11.

During the plastically deformation of the compact 12 in the plastic working device 13, strong outward stress is applied to the restricting members 15 placed in the lateral direction. Therefore, as shown in FIG. 8D, a fixing position ring 15a may be provided so as to surround the outer periphery of the restricting members 15 placed in the lateral direction. By this configuration, the stress that is applied to the restricting members 15 placed in the lateral direction may be endured by the fixing position ring 15a.

As described above, in the N type thermoelectric semiconductor material 17 of the present invention, by slowly cooling and solidifying molten raw alloy 8 using rotational roll 9, crystal grains 11 are oriented in the direction of the plate thickness, and made long to extending throughout entire plate thickness, and thereby have an improved crystalline orientation. In addition raw thermoelectric semiconductor materials 10 have a structure in which Te rich phases are precipitated, as hetero phase low melting point, in the crystal grains or grain boundaries. Along with maintaining the crystalline orientation and the textual structure comprising $Bi_2(Te$—$Se)_3$ based complex compound semiconductor phases dispersing the above-described Te-rich phase, the raw thermoelectric semiconductor materials 10 are solidified and formed to form the compact. The compact is expanded only in a uniaxial direction approximately parallel to the direction of the plate thickness of the raw thermoelectric semiconductor material 10, that is, the layering direction of the raw thermoelectric semiconductor material 10. Because of the above-described configuration, in the N type thermoelectric semiconductor material, crystal strain is generated by the presence of the hetero phase within crystal grains and grain boundaries, as well as by the presence of grain boundaries. By the generation of the crystal strain, thermal conductivity can be reduced. In addition, since the directions of c-axes and extending directions of C face of the hexagonal structure of the crystal grains 11 are approximately uniformly oriented throughout the entire body of the thermoelectric semiconductor material 17, thermoelectric performance (of which the Figure-of-Merit is Z) can be enhanced by setting the direction for conveying a current and heat to the extending direction of C face of the crystal grains 11.

Figure 4:
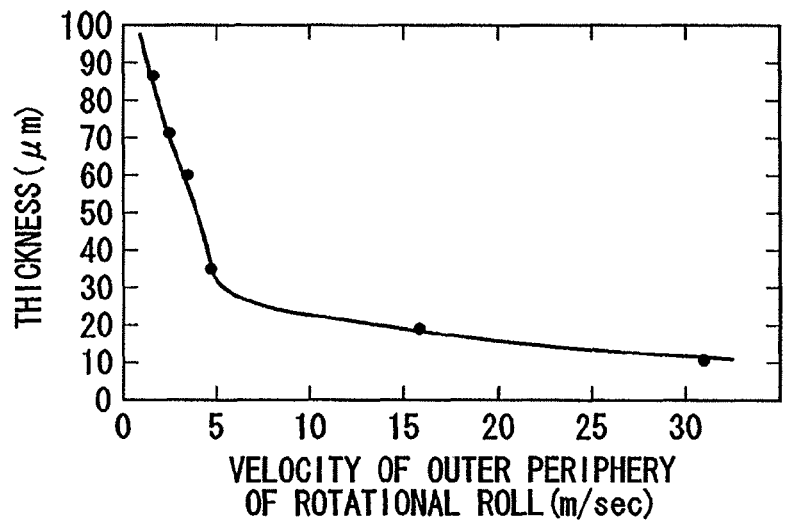
FIG. 4 is a graph showing the correlation between the thickness of a raw thermoelectric semiconductor material formed in the slow cooling foil manufacturing process of FIG. 1 and the circumferential velocity of the cooling roll.
Figure 10:
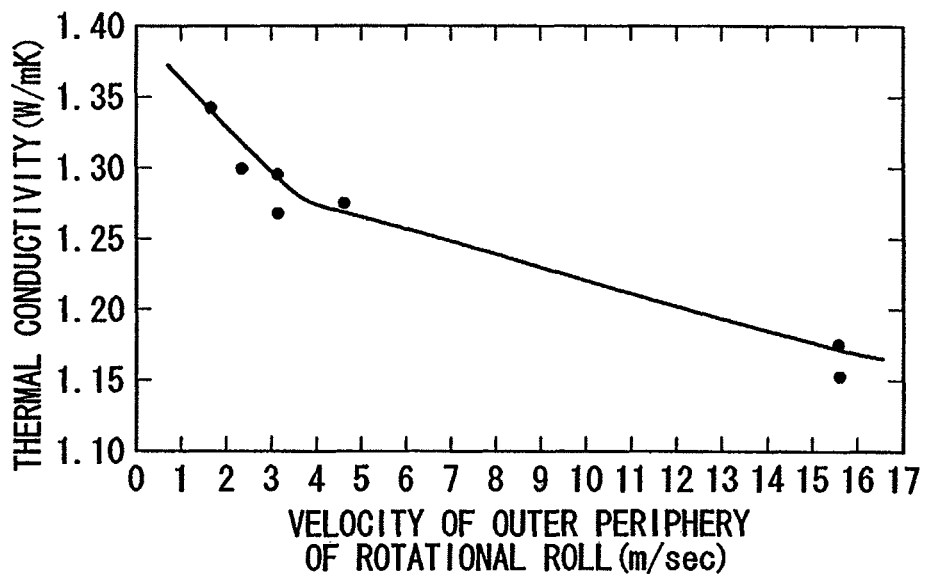
FIG. 10 is a graph showing the correlation between the circumferential velocity of the cooling roll in the slow cooling foil manufacturing process of FIG. 1 and the thermal conductivity of the thermoelectric semiconductor material formed in the plastically deforming process of FIG. 1 using a raw thermoelectric semiconductor material formed in the slow cooling foil manufacturing process.

As shown in FIG. 4, the circumferential velocity of rotational roll 9 is set at a rate as low as 5 m/sec, so that raw thermoelectric semiconductor materials 10 having thickness of no less than 30 μm can be achieved. By using a rotational roll of the above-described low speed rotation, the thermal conductivity (κ) of manufactured thermoelectric semiconductor material 17 can be increased compared to the case using raw thermoelectric semiconductor material 10 made by the rotational roll 9 of high rotational speed. As shown in FIG. 10, the above description is clearly shown in the relationship, between the rotational speed of rotational roll 9 during the manufacture of slow cooling foils as raw thermoelectric semiconductor materials 10, and the thermal conductivity (κ) of the thermoelectric semiconductor material 17 manufactured from the raw thermoelectric semiconductor materials 10 through the above-described process.

Figure 11:
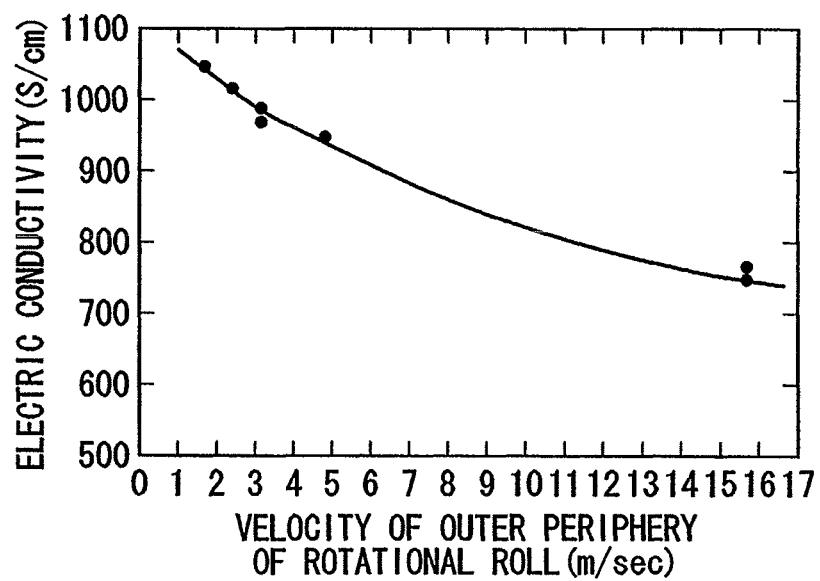
FIG. 11 is a graph showing the correlation between the circumferential velocity of the cooling roll in a slow cooling foil manufacturing process of FIG. 1 and the electric conductivity of a thermoelectric semiconductor material that is formed in the plastically deforming process of FIG. 1 using a raw thermoelectric semiconductor material formed in this slow cooling foil manufacturing process.

In addition, as shown in FIG. 11, as it is clearly indicated by the relationship between the rotational speed of rotational roll 9 during manufacturing slow cooling foils as raw thermoelectric semiconductor materials 10 and electric conductivity (σ) of manufactured thermoelectric semiconductor material 17, by using a rotational roll of the low rotational speed like the above described value, electric conductivity (σ) of manufactured thermoelectric semiconductor material 17 can be increased, compared to the case using raw thermoelectric semiconductor materials 10 produced by a rotational roll 9 of high rotational speed.

Figure 12:
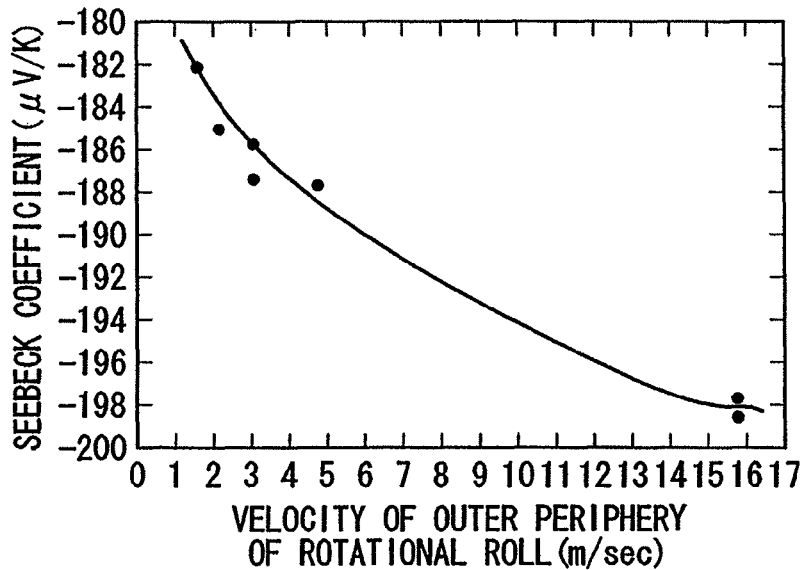
FIG. 12 is a graph showing the correlation between the circumferential velocity of the cooling roll in a slow cooling foil manufacturing process of FIG. 1 and the Seebeck coefficient of a thermoelectric semiconductor material formed in a plastically deforming process of FIG. 1 using the raw thermoelectric semiconductor material formed in the slow cooling foil manufacturing process.

Furthermore, as shown in FIG. 12, as it is clearly indicated from the relationship between the rotational speed of the rotational roll 9 during manufacturing the slow cooling foils as raw thermoelectric semiconductor materials 10 and the Seebeck coefficient (α) of manufactured thermoelectric semiconductor material 17, by using a rotational roll of the low rotational speed like the above described value, the Seebeck coefficient (α) of manufactured thermoelectric semiconductor material 17 can be increased, compared to the case using raw thermoelectric semiconductor materials 10 produced by a rotational roll 9 of high rotational speed.

Figure 13:
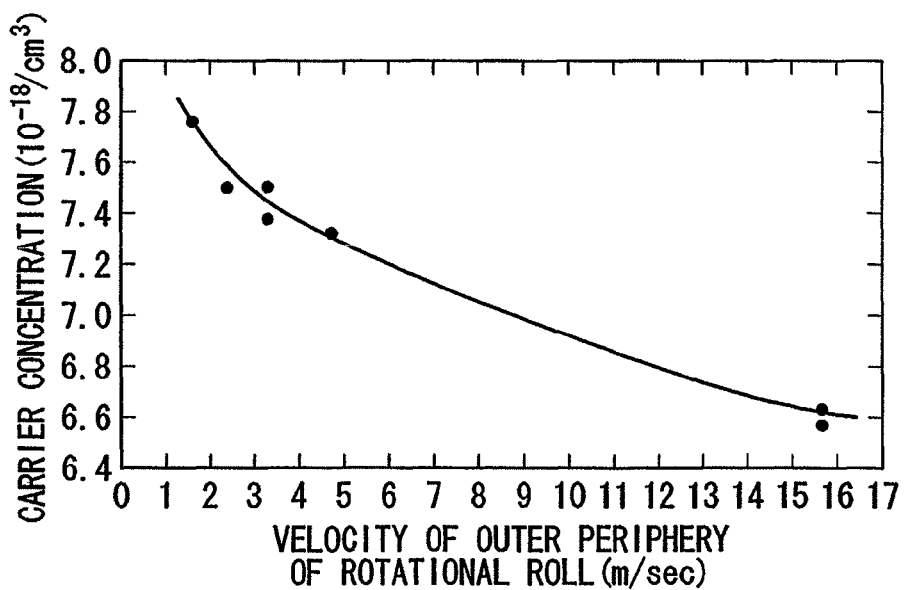
FIG. 13 is a graph showing the correlation between the circumferential velocity of a cooling roll in a slow cooling foil manufacturing process of FIG. 1 and the carrier concentration of the thermoelectric semiconductor material formed in the plastically deforming process of FIG. 1 using a raw thermoelectric semiconductor material formed in the slow cooling foil manufacturing process.

Moreover, as shown in FIG. 13, as it is clearly indicated from the relationship between the rotational speed of rotational roll 9 during manufacturing slow cooling foils as raw thermoelectric semiconductor materials 10 and the concentration of the carriers of manufactured thermoelectric semiconductor material 17, by using a rotational roll of the low rotational speed like the above described value, the concentration of the carriers of manufactured thermoelectric semiconductor material 17 can be increased, compared to the case using raw thermoelectric semiconductor materials 10 produced by a rotational roll 9 of high rotational speed.

Figure 14:
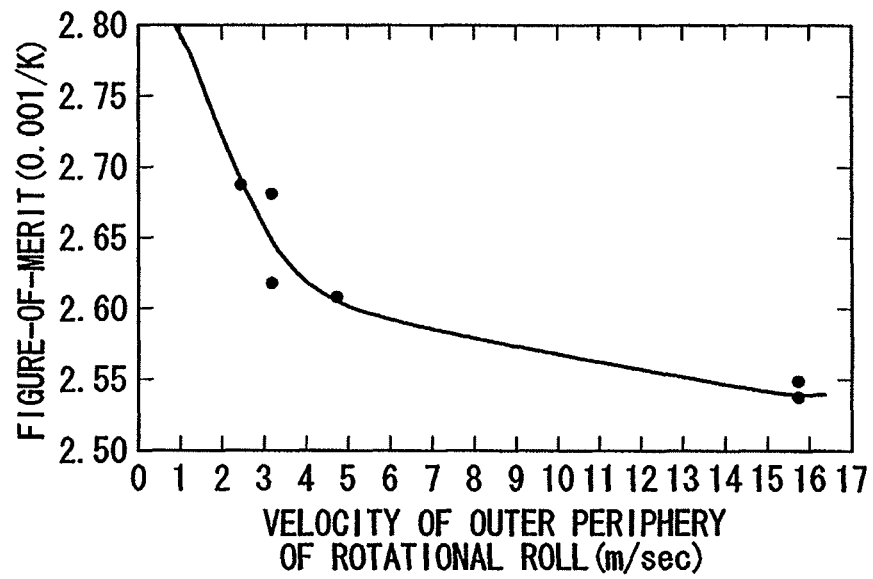
FIG. 14 is a graph showing the correlation between the circumferential velocity of the cooling roll in the slow cooling foil manufacturing process of FIG. 1 and the Figure-of-Merit of the thermoelectric semiconductor material formed in the plastically deforming process of FIG. 1 using the raw thermoelectric semiconductor material formed in this slow cooling foil manufacturing process.

Accordingly, as shown in FIG. 14, as it is clearly indicated from the relationship between the rotational speed of the rotational roll 9 during manufacturing slow cooling foils as the raw thermoelectric semiconductor materials 10 and the Figure-of-Merit (Z) of manufactured thermoelectric semiconductor material 17, in the thermoelectric semiconductor material 17 manufactured, through the above-described procedures, from the raw thermoelectric semiconductor material 10 that has been manufactured by the rotational roll 9 of slow speed, the Figure-of-Merit (Z) is increased compared to the case using the raw thermoelectric semiconductor materials 10 produced by a rotational roll 9 of high rotational speed.

Figure 15:
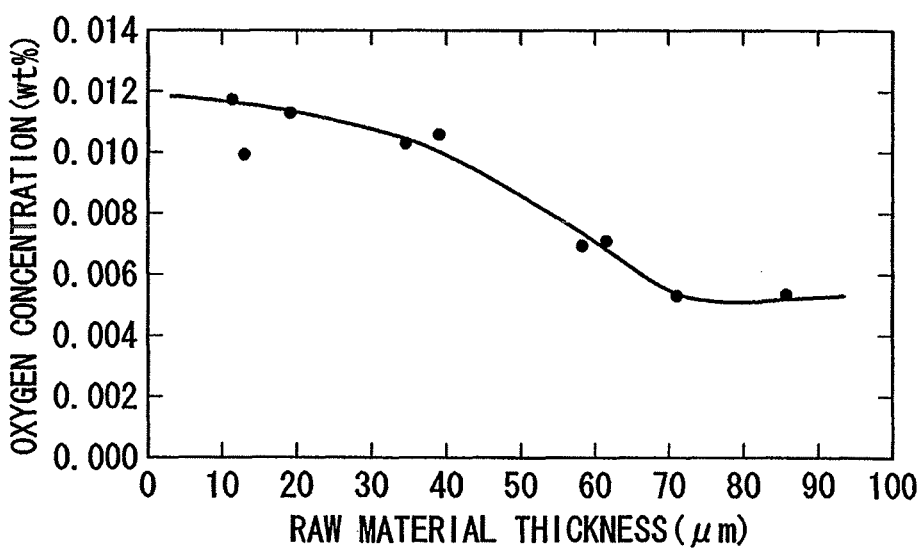
FIG. 15 is a graph showing the correlation between the thickness and the oxygen concentration of the raw thermoelectric semiconductor material formed in a slow cooling foil manufacturing process of FIG. 1.

Furthermore, as shown in FIG. 4, in the above-described thermoelectric semiconductor material 17 according to the present invention, the thickness of the slow cooling foils manufactured as raw thermoelectric semiconductor materials 10 can be increased by slowing the rotational speed of rotational roll 9, and thereby the specific surface area can be reduced. As a result, as it is clear from FIG. 15 showing a relationship between the thickness of slow cooling foils as raw thermoelectric semiconductor materials 10 and the oxygen concentration, measured by an infrared absorption method, contained in the raw thermoelectric semiconductor materials 10, oxidization of raw thermoelectric semiconductor materials 10 can be restricted and the oxygen concentration in thermoelectric semiconductor material 17 manufactured from the raw thermoelectric semiconductor materials 10 can be reduced.

Figure 5:
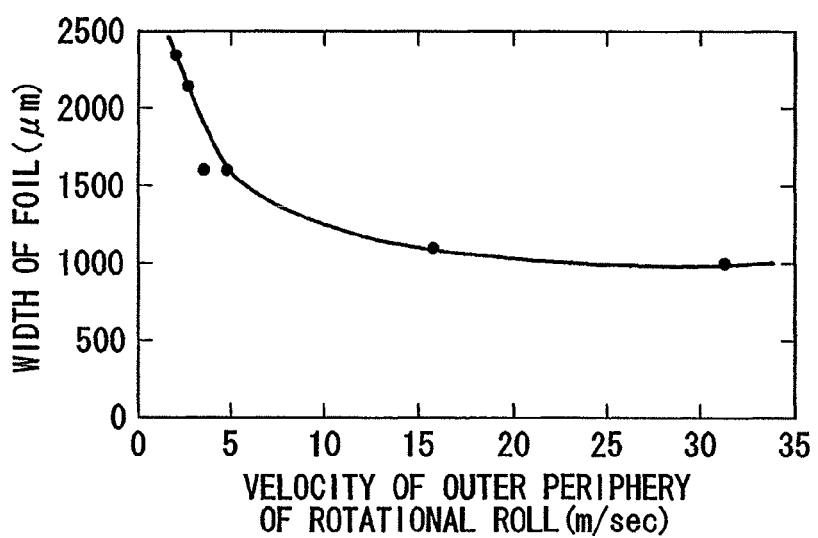
FIG. 5 is a graph showing the correlation between the width of the raw thermoelectric semiconductor material formed in the slow cooling foil manufacturing process of FIG. 1 and the circumferential velocity of the cooling roll.
Figure 16:
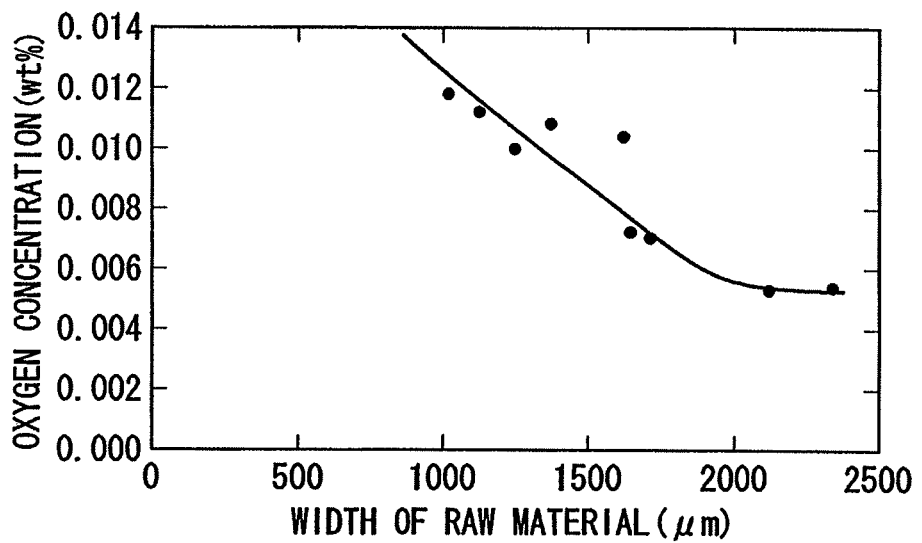
FIG. 16 is a graph showing the correlation between the width and oxygen concentration of the raw thermoelectric semiconductor material that is formed in a slow cooling foil manufacturing process of FIG. 1.

In addition, as shown in FIG. 5, the width of the slow cooling foils manufactured as the raw thermoelectric semiconductor materials 10 can be increased by slowing the rotational speed of rotational roll 9, and thereby the specific surface area can be reduced. As a result, as it is clear from FIG. 16 showing the relationship between the width of slow cooling foils as raw thermoelectric semiconductor materials 10, and the oxygen concentration, measured by an infrared absorption method, contained in the raw thermoelectric semiconductor materials 10, oxidization of the raw thermoelectric semiconductor materials 10 can be restricted in the same manner as described above, and the oxygen concentration in manufactured thermoelectric semiconductor material 17 can be reduced.

Figure 17:
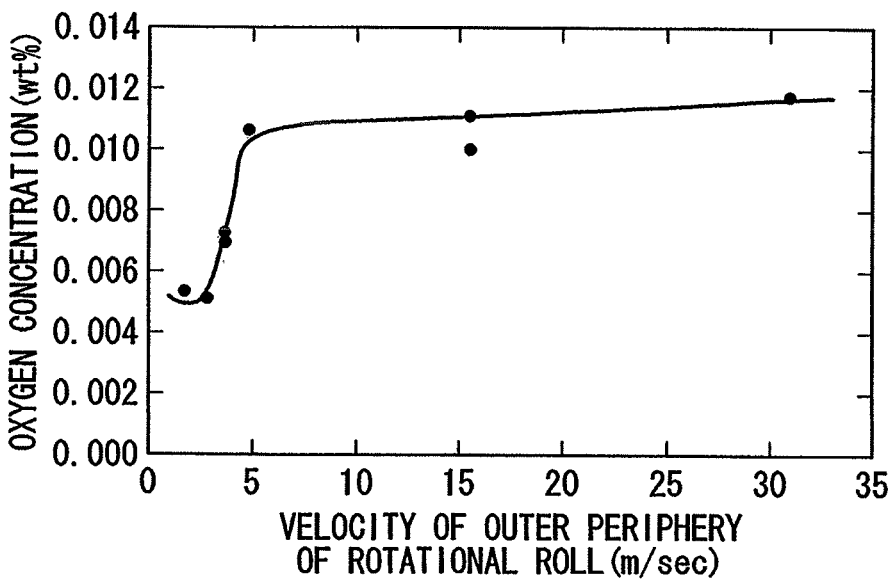
FIG. 17 is a graph showing the correlation between the circumferential velocity of the cooling roll in a slow cooling foil manufacturing process of FIG. 1 and the oxygen concentration of the raw thermoelectric semiconductor material formed in the slow cooling foil manufacturing process.

Accordingly, as it is clear from FIG. 17 showing the relationship between the rotational speed of the rotational roll 9 and the oxygen concentration in thermoelectric semiconductor material 17, the oxygen concentration contained in manufactured thermoelectric semiconductor material 17 can be reduced by slowing the rotational speed of the rotational roll 9. Therefore, it is possible to prevent lowering of the electric conductivity ($\sigma$) due to oxidation.

Figure 18:
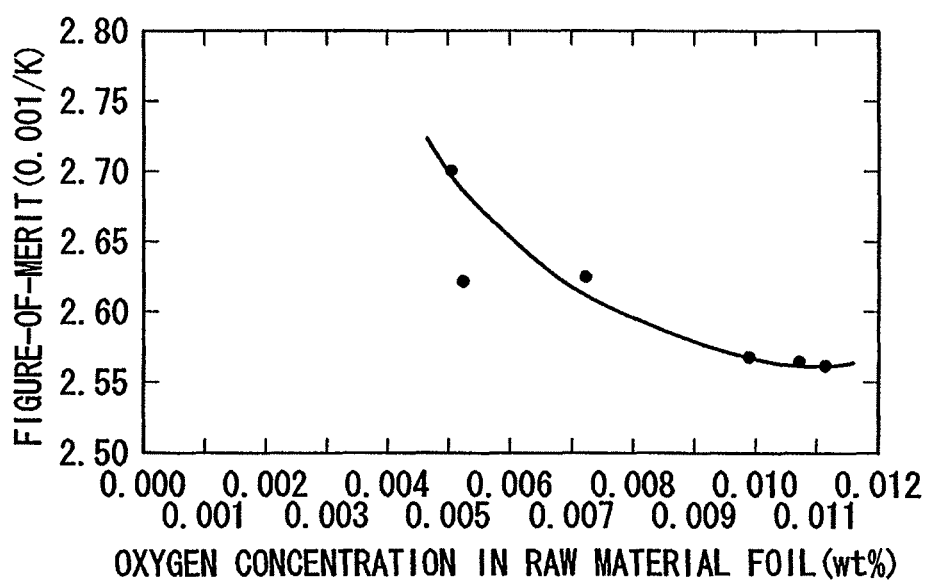
FIG. 18 is a graph showing the correlation between the oxygen concentration in the raw thermoelectric semiconductor material that is manufactured in the slow cooling foil manufacturing process of FIG. 1 and the Figure-of-Merit of the thermoelectric semiconductor material formed using the raw thermoelectric semiconductor material.

Therefore, as it is clear FIG. 18 showing the relationship between the oxygen concentration in slow cooling foils as raw thermoelectric semiconductor materials 10, and the Figure-of-Merit, by reducing the oxygen concentration contained in manufactured thermoelectric semiconductor material 17, the thermoelectric performance of the thermoelectric semiconductor material 17 can be increased.

The electric conductivity ($\sigma$) and the Seebeck coefficient ($\alpha$) of the above-described manufactured N type thermoelectric semiconductor material 17 can be controlled, by adjusting the ratio of Te to Se in the $Bi_2(Te-Se)_3$ based composition, which is the standard for N type thermoelectric semiconductor compositions.

Figure 19:
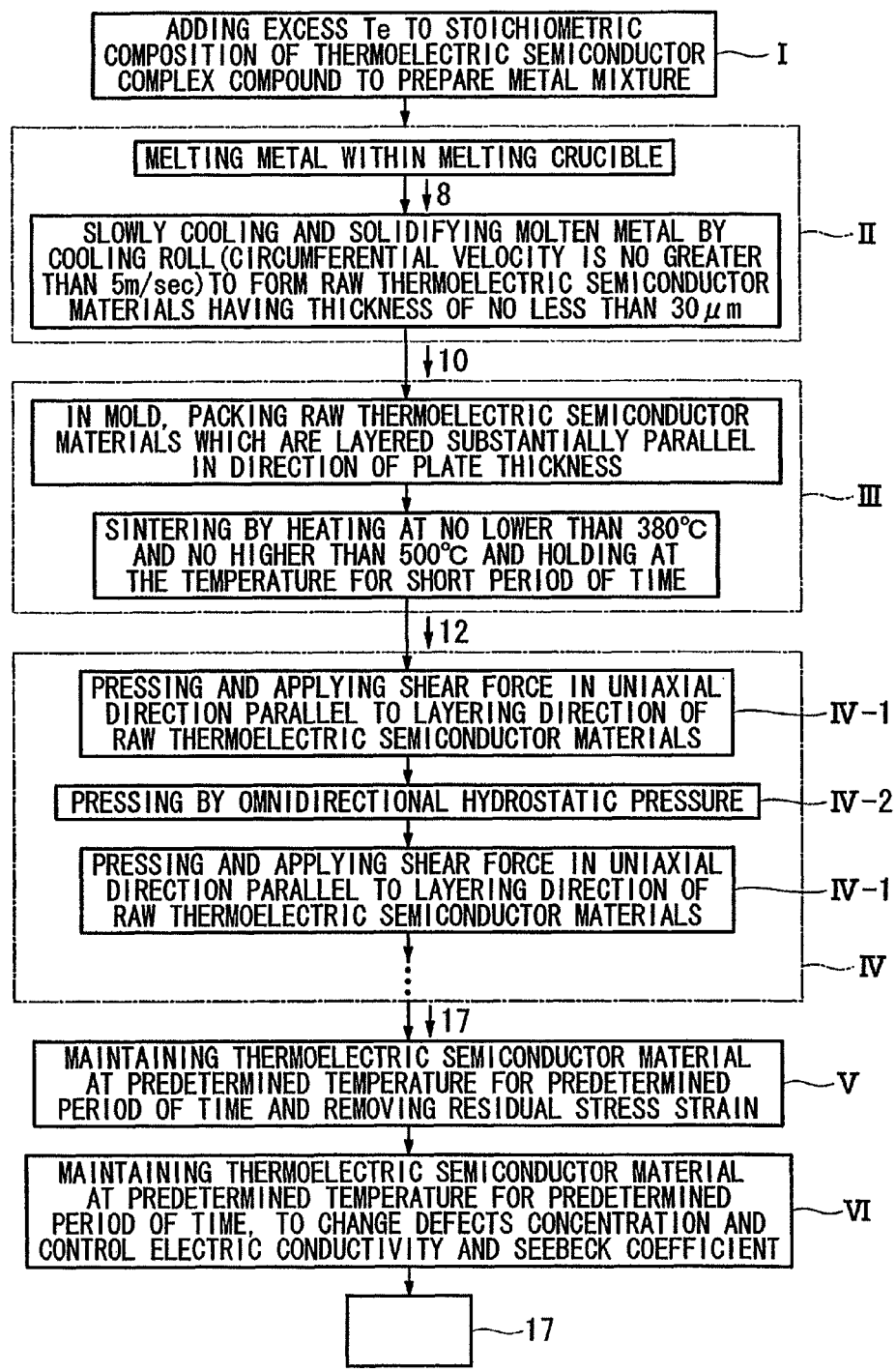
FIG. 19 is a flow chart showing another embodiment of a manufacturing method for the thermoelectric semiconductor material according to the present invention.

FIG. 19 is a flow chart showing another embodiment of a manufacturing method for a thermoelectric semiconductor material of the present invention. In this embodiment, in plastically deforming process IV during the manufacturing procedure of a thermoelectric semiconductor material in the same manner as described above, when a compact 12 is pressed, and a shear force is applied in a uniaxial direction parallel to the layering direction of the slow cooling foils of the raw thermoelectric semiconductor materials 10, so that the compact is plastically deformed to a predetermined form, one or more times of omnidirectional hydrostatic pressure process IV-2 may be carried out during the process of the uniaxial shear force applying process IV-1 for plastically deforming an object, for example, at the time in which ratio of deformation is low. In the omnidirectional hydrostatic pressure process IV-2, during the plastic deformation of the compact 12, deformation of the compact 12 is temporarily restricted by contact with planes placed in the direction of deformation, and at that state, a pressure is continuously applied over a given period of time.

Figure 20A:
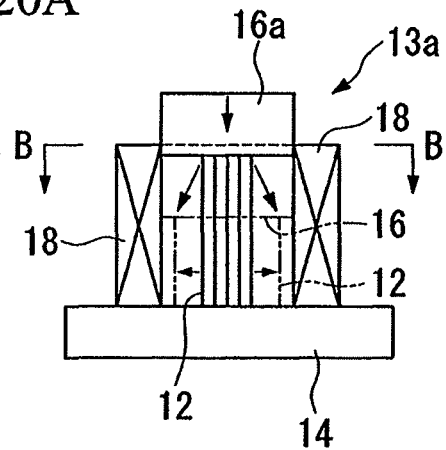
FIG. 20A is a diagram showing a plastic working device used for an omnidirectional hydrostatic pressure process of FIG. 19 and is a schematic cross sectional side view of the device in the initial state before the plastic deformation of a compact.
Figure 20B:
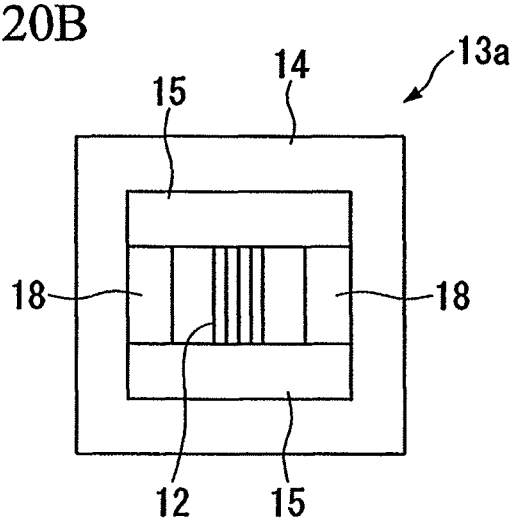
FIG. 20B is a diagram showing the device of FIG. 20A as viewed along line B-B in the direction of the arrows.
Figure 20C:
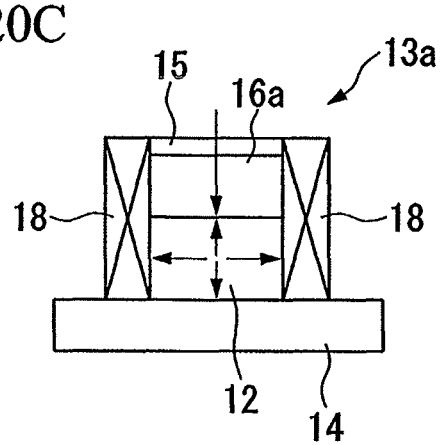
FIG. 20C is a diagram showing the plastic working device used for an omnidirectional hydrostatic pressure process of FIG. 19 and is a schematic cross sectional side view of the device in a state in which omnidirectional hydrostatic pressure is applied to a compact that has been plastically deformed by a predetermined amount.

Accordingly, when the above-described omnidirectional hydrostatic pressure process IV-2 is carried out, as shown in FIGS. 20A, 20B, and 20C, within a plastic working device 13 having similar configuration as shown in FIGS. 8A, 8B, and 8C, a pair of front and rear restricting members 18, each having approximately parallel surface opposed to each other intervening a predetermined spacing are provided at positions between restricting members 15 at the lateral sides so as to form a configuration in which the space between the above-described restricting members 15 placed in the lateral direction is closed on the anteroposterior sides. When a compact 12 formed in solidification forming process III is placed in the center portion of the inside between the above-described restricting members 15 placed in the lateral direction so that the layering direction of the raw thermoelectric semiconductor materials 10 constructing the compact 12 is parallel to the surfaces of restricting members 15 placed in the lateral direction, a predetermined gap is formed between the above-described compact 12 and front and rear restricting members 18 so as to provide a space for deformation of the compact. In addition, a punch 16a having a plane form corresponding to the space surrounded by the above-described restricting members 15 and 18 at lateral and anteroposterior sides, is provided so as to be moveable in the upward and downward directions within the above-described space by a vertical driving unit, not shown. Furthermore, heating units, not shown, are provided at predetermined positions on base 14, restricting members 15 and 18, and punch 16a. Along with preparing a plastic working device 13a having above-described configuration, a plastic working device 13 shown in FIGS. 8A, 8B, and 8C, is also prepared.

When a plastic working process IV is carried out, firstly, as shown in FIGS. 20A and 20B, compact 12 formed in solidification forming process III is placed in the center portion between restricting members 15 placed in the lateral direction in the plastic working device 13a. After that, temperature conditions and pressure conditions are adjusted as same as in the above-described plastically deforming process IV, and punch 16a is lowered by the vertical driving unit so that pressure is applied to the compact 12 from above by the lowering punch 16a. Then, as shown by two-dot chain lines in FIG. 20A, since the two sides in the direction of the width of the compact 12 are restricted by restricting members 15 placed in the lateral direction, shear force is applied in a uniaxial anteroposterior direction approximately parallel to the layering direction of the raw thermoelectric semiconductor materials 10 forming the compact. As a result, the compact is plastically deformed and flattened in the anteroposterior direction. Thus, a uniaxial shear force applying process IV-1 is carried out. After that, plastic deformation continues in the anteroposterior direction, and thereby, as shown in FIG. 20C, the plastically deformed body of the compact 12 is made to be contacted with the front and rear restricting members 18. In this state, when further pressure is applied from above by the punch 16a, the deformed body of the compact 12 is restricted by the restricting members 15 placed in the lateral direction at two sides in the direction of the width, and also restricted by restricting members 18 at two sides in the anteroposterior direction, and thereby prevented from deformation. Therefore, pressure provided by the punch 16a is applied to the deformed body of the compact 12 as omnidirectional hydrostatic pressure. As described above, the omnidirectional hydrostatic pressure process IV-2 is carried out.

After that, the plastically deformed body of compact 12 which has been expanded (plastically deformed) in the anteroposterior direction until it contacts front and rear restricting members 18, is taken out from the plastic working device 13a, and the plastically deformed body of the compact 12 is placed in the center portion between restricting members 15 placed in the lateral direction of plastic working device 13 in the same manner as described in reference to FIGS. 8A, 8B, and 8C. After that, punch 16 is lowered so as to press further the plastically deformed body of the above-described compact 12 from above, and thereby, the plastically deformed body of the compact 12 is further expanded by applying a shear force in the anteroposterior direction, which is an uniaxial direction approximately parallel to the layering direction of raw thermoelectric semiconductor materials 10 constructing the compact 12 before plastic deformation. Thus, the uniaxial shear force applying process IV-1 is carried out, and thermoelectric semiconductor material 17 is manufactured.

The above-described omnidirectional hydrostatic pressure process IV-2 may be carried out two or more times. In this case, a plurality of plastic working devices 13a, in which the distance between front and rear restricting members 18 increases step by step, are prepared and the devices are sequentially used from the one having smallest distance between front and rear restricting members 18 is the smallest to the one having the largest distance between front and rear restricting members 18. Pressure is applied to the compact 12 formed in solidification forming process III from above by lowering the punch 16a in the same manner as described above, and thus, a shear force is applied in a uniaxial direction approximately parallel to the layering direction of raw thermoelectric semiconductor materials 10. As a result, the compact is plastically deformed so that the amount of deformation from the initial state sequentially increases. After that, omnidirectional hydrostatic pressure is applied in a state in which deformation is restricted by front and rear restricting members 18, and finally, the compact may be plastically deformed so as to expand in the anteroposterior direction by the plastic working device 13 not having the front and rear restricting members 18.

In this case, by caring out the above-described omnidirectional hydrostatic pressure process IV-2 on a compact 12 during plastic deformation in the uniaxial shear force applying process IV-1, the density of the above-described compact 12 during plastic deformation can be increased. Therefore, a possibility of occurrence of buckling is prevented in the compact 12 on which the plastically deforming process is finally carried out in the plastic working device 13. In addition, two end portions of the compact 12 in the anteroposterior direction, which are the end portions in the direction of plastic deformation, are pressed against front and rear restricting members 18, and thereby, the forms of the two end portions in the anteroposterior direction, of the compact 12 are adjusted at a stage during plastic deformation. Thus, the deformation rate of the compact 12 can be made uniform, and therefore, it is possible to enhance the homogeneity of the texture of manufactured thermoelectric semiconductor material 17.

When the omnidirectional hydrostatic pressure process IV-2 is carried out, due to the contact of the end portions of the compact 12 in the anteroposterior direction with front and rear restricting members 18, there is a possibility that the orientation of C face of crystal grains 11 may be slightly disordered in the end portions of the compact 12 in the anteroposterior direction. Whereas, finally in plastic working device 13, a shear force is applied in a uniaxial direction approximately parallel to the layering direction of raw thermoelectric semiconductor material 10 constructing the compact 12 so that the compact is expanded without restriction in the anteroposterior direction.

Therefore, it is possible to uniformly align the direction of C face and the direction of c-axis of crystal grains 11 even in the end portions in the anteroposterior direction of manufactured thermoelectric semiconductor material 17.

Furthermore, in a manufacturing method for a thermoelectric semiconductor material of the present invention, as shown in FIG. 19, a stress strain processing process V is provided as the process after the above-described plastically deforming process IV. In the stress strain processing process V, the thermoelectric semiconductor material 17, manufactured and plastically deformed into a predetermined form in plastically deforming process IV may be maintained at a predetermined temperature, for example at a temperature from 350° C. to 500° C., for a predetermined period of time, for example, for 30 minutes to 24 hours so that dislocations or vacancies of crystal lattice are reduced or reconstructed as a result of heat treatment. As a result, stress strain which is generated as a result of the plastic deformation in the plastically deforming process IV and remains in the structure of thermoelectric semiconductor material 17 may be eliminated. It is clear that the same effects can be obtained in the stress strain processing process V even when the temperature condition is maintained for 24 hours or more.

Moreover, a defect concentration controlling process VII may be provided as the process after the above-described stress strain processing process VI. By holding the thermoelectric semiconductor material 17, from which residual stress strain has been removed in the above-described stress strain processing process VI, at a predetermined temperature for a predetermined period of time in the defect concentration controlling process VII, the concentration of defects in the thermoelectric semiconductor material 17 may be changed, and therefore, the electric conductivity ($\sigma$) and the Seebeck coefficient ($\alpha$) may be controlled.

The thermoelectric semiconductor material 17 manufactured in the plastically deforming process IV retains a structure of raw thermoelectric semiconductor materials 10 constructing the compact 12, namely $Bi_2(Te\text{---}Se)_3$ based complex compound semiconductor including hetero phases (Te rich phases) in the crystal grains or in the grain boundaries. Since the excess Te is a component of the $Bi_2(Te\text{---}Se)_3$ based thermoelectric semiconductor, when the above-described thermoelectric semiconductor material 17 is heat treated, the excess Te reacts with the main component of $Bi_2(Te\text{---}Se)_3$ based semiconductor, and fill in the defects of the main component. When a slight amount of dopant such as Ag is introduced in the main component, performance changes largely. Such dopant has a large influence even when it is distributed in the grain boundaries. Performance may change largely, if the dopant diffuse into the main component portion by the use at a high temperature or by a heat treatment. It is considered that the change in the concentration of defects in thermoelectric semiconductor material 17 due to the excess Te can provide effects which cancel or accelerate the effects of the dopant.

Next, as manufacturing method for a thermoelectric semiconductor element according to the present invention, a case in which N type thermoelectric semiconductor element 3a is manufactured using N type thermoelectric semiconductor material 17 manufactured in accordance with the embodiments shown in FIGS. 1 to 18 is described in the following.

In this case, in the N type thermoelectric semiconductor material 17, the extending direction of C face and the direction of c-axis of the hexagonal structure of crystal grains 11 are uniformly aligned throughout the entire structure. Therefore, considering the orientation of crystal grains 11 having uniform orientation, thermoelectric semiconductor element 3a is formed by being cut out from the material, so that the direction in which a current and heat are conveyed can be set in the extending direction of C face in the hexagonal structure of crystal grains 11.

In the N type thermoelectric semiconductor material 17, as shown in FIG. 9B, C face of the hexagonal structure in each crystal grain extends in the direction of expansion of the compact 12 during plastic deformation (direction of arrow t), and c-axis is oriented approximately in the direction of pressure (direction of arrow p) during the plastic deformation. Therefore, first, as shown in the upper portion of FIG. 21, at predetermined spacing position in the direction of expansion of the compact 12 during the plastic deformation (direction of arrow t), the thermoelectric semiconductor material 17 is sliced along a plane perpendicular to the direction of expansion, and a wafer 19 is cut out, as shown in the middle of FIG. 21.

As a result, C face of the hexagonal structure of crystal grains 11 is oriented in the direction of the thickness of the above-described wafer 19.

Next, a conductive material processed surfaces 20 are formed by processing the both end surfaces of the wafer 19, for example, by a plating process by a plating device, not shown. Subsequently, as shown by two-dot chain lines in the middle portion of FIG. 21, the wafer 19 processed with conductive material is cut along two planes: a plane perpendicular to the direction (direction of arrow p) in which compact 12 is pressed during the manufacture of the thermoelectric semiconductor material 17; and a plane defined by two axes of the direction of pressing (direction of arrow p) and the direction of expansion (direction of arrow t) during the manufacture of the thermoelectric semiconductor material 17. Thus, a rectangular solid form, as shown in the lower portion of FIG. 21 is cut out (diced), and thereby the N type thermoelectric semiconductor element 3a is manufactured.

Figure 21:
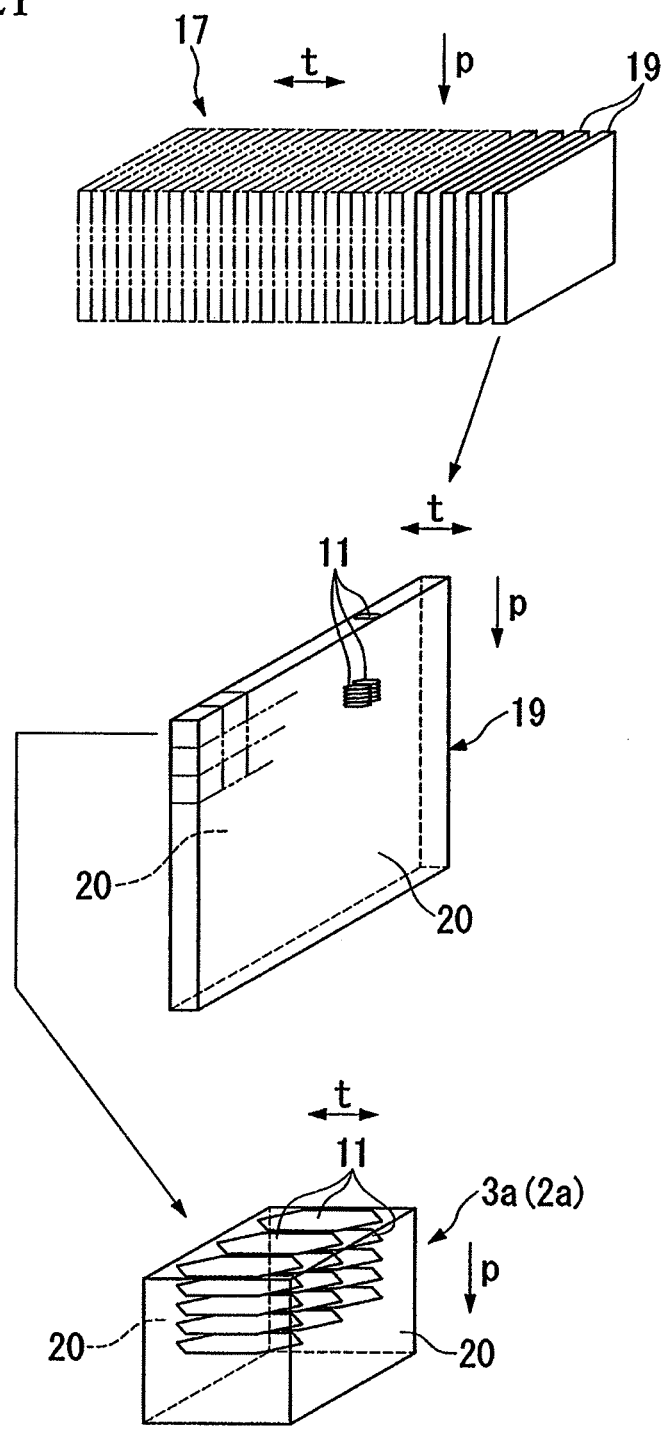
FIG. 21 is a schematic perspective diagram showing steps of the manufacturing method for a thermoelectric semiconductor element of the present invention, and showing a state for slicing a thermoelectric semiconductor material, a sliced wafer, and a thermoelectric semiconductor element cut out from a wafer.

As a result, the above-described N type thermoelectric semiconductor element 3a has a crystal structure in which, as shown in the lower portion of FIG. 21, C face of the hexagonal structure of crystal grains 11 extends throughout long length in the direction (as shown by arrow t in the figure, the same direction as the direction of expansion of the thermoelectric semiconductor material 17 during the manufacture) of a pair of opposing surfaces 20 which are processed with a conductive material. The pair of the surface 20 correspond to conductive material processed surfaces 20 of the wafer 19 processed with a conductive material. In addition, c-axes of crystal grains 11 extend in the direction of pressing (direction of arrow p in the figure) during the manufacture of the thermoelectric semiconductor material 17 among the two axial directions perpendicular to the conductive material processed surface 20.

Accordingly, by attaching a metal electrode (not shown) to the above-described conductive material processed surface 20, an N type thermoelectric semiconductor element 3a having excellent thermoelectric performance can be obtained, by making the element to have a textual structure in which the direction of c-axis, as well as the direction of C face of the hexagonal structure of the crystal grains 11 are uniformly oriented, and allowing the current and heat to be applied in the direction of C face of the hexagonal structure of the above-described crystal grains 11.

Next, a case in which a P type thermoelectric semiconductor material is manufactured is described. In this case, to prepare a stoichiometric composition of a raw alloy of an P type thermoelectric semiconductor in a component mixing process I shown in FIG. 1, Bi, Sb and Te are weighed so that the raw alloy contains 7 to 10 atomic % of Bi, 30 to 33 atomic % of Sb, and 60 atomic % of Te. The weighed metals are mixed to obtain a $(Bi—Se)_2 Te_a$ based composition. Furthermore an excess Te is aided so that 0.1 to 5% by weight of Te is contained in the entire $(Bi—Se)_2 Te_3$ based component, and thus an alloy having excess Te is prepared. At that time, a predetermined amount of dopant for forming a P type thermoelectric semiconductor, such as Ag or Pb may be added.

Subsequently, in the same manner as in the case for manufacturing above-described N type thermoelectric semiconductor material 17, in slow cooling foil manufacturing process II using a device shown in FIG. 2, molten alloy 8 of the metal mixture that has been mixed in the above-described component preparing process I is supplied from a nozzle of melting crucible 6, having a diameter of 0.5 mm to a surface of rotational roll 9 slowly rotating at a circumferential velocity of 5 m/sec or less, preferably at a circumferential velocity of 2 m/sec or less, so as to be slowly cooled and solidified, and thereby, plate shaped raw thermoelectric semiconductor materials 10 (slow cooling foil) are manufactured.

The circumferential velocity of rotational roll 9 is set at 5 m/sec or less, preferably 2 m/sec or less. By using such velocity, in the same manner as in the case for forming the N type raw thermoelectric semiconductor material 10, the slow cooling foils are manufactured to have a thick thickness of 30 μm or more, preferably, the slow cooling foils are formed to have a thickness of no less than 70 μm, and thereby, raw thermoelectric semiconductor materials 10 having an excellent crystalline orientation and large crystal grains 11 extending throughout almost entire plate thickness can be obtained. At the same time, the widths of the slow cooling foils manufactured as raw thermoelectric semiconductor material 10, are increased, the volume of a single piece of the raw thermoelectric semiconductor material 10 is increased, and thereby the specific surface area of the piece can be reduced.

As a result, in the same manner as the above-described N type raw thermoelectric semiconductor material 10, when the P type raw thermoelectric semiconductor material 10 is cooled on rotational roll 9, the crystal structures of the complex compound semiconductor phases of $Bi_2Te_3$ and $Sb_2Te_3$ are respectively solidified and crystallized, in which crystalline orientation is aligned in the direction of the plate thickness. At the same time, Te rich phases including excess Te in the composition of $Bi_2Te_3$ or $Sb_2Te_3$ are microscopically dispersed as a non-amorphous separated phase in the crystal grains and grain boundaries of the respective complex compound semiconductor phases of $Bi_2Te_3$ and $Sb_2Te_3$. Thus a raw thermoelectric semiconductor material 10 that is thought to have a structure having crystal strain by precipitation of hetero phase (Te-rich phase) or by nucleation of hetero phase nuclei within crystal grains and grain boundaries of the $(Bi—Sb)_2Te_3$ based complex compound semiconductor, can be achieved. In this raw thermoelectric semiconductor material 10, in the same manner as that shown in FIG. 3, crystal grains 11 extend in approximately the direction of the plate thickness, and the crystal grains have a length almost corresponding to the plate thickness. Powder particles may be removed in advance by sieving from the raw thermoelectric semiconductor materials, before the following solidification forming process III.

Subsequently, in solidification forming process III, slow cooling foils of P type raw thermoelectric semiconductor materials 10 manufactured in the slow cooling foil manufacturing process II, are layered in the direction approximately parallel to the direction of the plate thickness, and are packed in a mold, not shown. After that, the layered body is sintered under the same pressure and temperature conditions by a multistage heating method in the same manner as the manufacturing process of compact 12 having the N type composition. As a result, the layered raw thermoelectric semiconductor materials 10 are plastically worked, solidified and formed so that the respective pieces of raw thermoelectric semiconductor materials 10 are made to make contact with each other and the interstices between the raw thermoelectric semiconductor materials 10 are eliminated. Thus, a compact 12 in rectangular solid form in the same manner as those shown in FIGS. 7A, 7B, and 7C is manufactured.

As a result, no or only little limited amount of Te rich phases which have been formed in the P type raw thermoelectric semiconductor material 10 are converted to liquid phases during sintering. Therefore, the compact 12 is formed maintaining a structure comprising complex compound semiconductor phases having the composition of $Bi_2Te_3$ and $Sb_2Te_3$ microscopically dispersing Te rich phases containing excess Te in the above-described compositions.

Subsequently, in a plastically deforming process IV, in the same manner as in the case for manufacturing the N type thermoelectric semiconductor material 17, using a plastic working device 13 as shown in FIGS. 8A, 8B, 8C, and 8D, along with hating the compact 12 at a temperature no higher than 500° C., preferably, no higher than 350° C., the compact is plastically deformed so as to expand in a uniaxial direction approximately parallel to the layering direction of the raw thermoelectric semiconductor materials 10, and thereby, P type thermoelectric semiconductor material 17 is manufactured. The above-described temperature condition for heating is varied depending on the excessive amount of Te, and the processing temperature is increased with decreasing amount of excess Te.

As a result, by applying shear force only in the layering direction of raw thermoelectric semiconductor materials 10, in the same manner as those shown in FIGS. 9A and 9B, crystal grains 11 oriented in the direction of the plate thickness of the raw thermoelectric semiconductor material 10 in the compact 12 are plastically deformed so as to be flattened in the uniaxial direction in which the shear force is applied. In addition, the cleavage planes are oriented so as to be approximately perpendicular to the direction in which pressure is applied, and the compact is deformed so that C face of the hexagonal structure of each crystal grain 11 is extended in the direction of expansion (direction of arrow t in FIGS. 9A and 9B). At the same time, a P type thermoelectric semiconductor material 17 in which c-axes of most of crystal grains 11 are oriented in the direction of compression (direction of arrow p in FIGS. 9A and 9B) during the plastic deformation is formed.

Accordingly, in the P type thermoelectric semiconductor material 17, crystal strain is generated by the presence of the hetero phase within crystal grains and grain boundaries, as well as by the presence of grain boundaries. By the generation of the crystal strain, thermal conductivity (κ) can be reduced. In addition, since the directions of c-axes and extending directions of C face of the hexagonal structure of the crystal grains 11 are approximately uniformly oriented, thermoelectric performance (of which the Figure-of-Merit is Z) can be enhanced by setting the direction for conveying a current and heat to the extending direction of C face of the crystal grains 11.

Moreover, since the P type raw thermoelectric semiconductor material 10 is manufactured to have a large thickness and a large width, and therefore, have a small specific surface area, and is solidified and formed to manufacture P type thermoelectric semiconductor material 17, the oxygen concentration contained in the thermoelectric semiconductor material 17 can be reduced. Thus, a reduction in the electric conductivity (σ) due to oxidation can be prevented. By this reduction, an the thermoelectric performance of thermoelectric semiconductor material 17 can also be improved.

The electric conductivity (σ) and the Seebeck coefficient (α) of the P type thermoelectric semiconductor material 17 can be controlled by adjusting the amounts of Bi and Sb in the $(Bi-Sb)_2Te_3$ based composition, which is the standard of the composition of P type semiconductors. In addition, during the manufacturing process of the P type thermoelectric semiconductor material 17, omnidirectional hydrostatic pressure process IV-2 in plastically deforming process IV shown in FIG. 19 may be carried out. In addition, stress strain processing process V and defect concentration controlling process VI may be carried out as a post process of the plastically deforming process IV.

Next, a case in which P type thermoelectric semiconductor element 2a is manufactured using the P type thermoelectric semiconductor material 17 manufactured by the above-described method is described.

In this case, also in the above-described P type thermoelectric semiconductor material 17, in the same manner as N type thermoelectric semiconductor material 17 shown in FIGS. 9A and 9B, throughout entire textual structure, C face of the hexagonal structure of most of crystal grains 11 extend in the direction of expansion of the compact 12 during the plastic deformation (direction of arrow t in FIGS. 9A and 9B), and the c-axes are almost oriented in the direction of the pressure during the plastic deformation (direction of arrow p in FIGS. 9A and 9B). Therefore, in the same manner as in manufacturing method for N type thermoelectric semiconductor element 3a shown in FIG. 21, firstly, as shown in the upper portion of FIG. 21, at predetermined spacing position in the direction of expansion of the compact 12 during the plastic deformation (direction of arrow t), the thermoelectric semiconductor material 17 is sliced along a plane perpendicular to the direction of expansion, and thereby a wafer 19 is cut out, as shown in the middle of FIG. 21. After that conductive material processed surfaces 20 are formed by processing both end surfaces in the direction of thickness of the wafer 19 with conductive material. Subsequently, by cutting the wafer 19, a P type thermoelectric semiconductor element 2a of a rectangular solid form can be manufactured in the same manner as the N type thermoelectric semiconductor element 3a shown in the lower portion of FIG. 21.

As a result, the P type thermoelectric semiconductor element 2a has, in the same manner as the above-described N type thermoelectric semiconductor element 3a, a crystal structure in which C face of the hexagonal structure of crystal grains 11 extends throughout long length in the direction of a pair of opposing surfaces 20 which are processed with a conductive material. In addition, c-axes of crystal grains 11 extend in the direction of pressing (direction of arrow p)

during the manufacture of the thermoelectric semiconductor material 17 among the two axial directions perpendicular to the conductive material processed surface 20. Therefore the P type thermoelectric semiconductor element has an excellent thermoelectric performance.

As another embodiment of the present invention, a thermoelectric module that uses P type and N type thermoelectric semiconductor elements 2a and 3a that have been manufactured in accordance with the above-described method of the present invention, and manufacturing method of the thermoelectric module are described.

Figure 22:
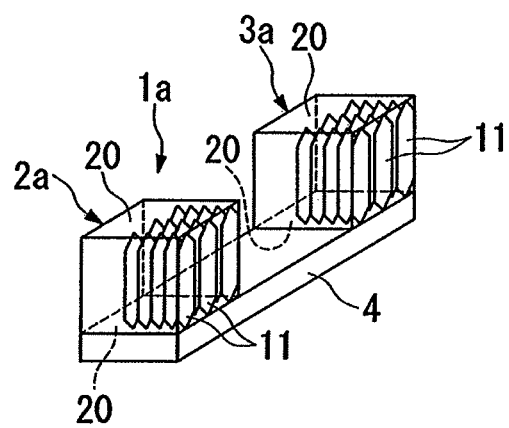
FIG. 22 is a schematic perspective diagram showing an embodiment of a thermoelectric module according to the present invention.
Figure 27:
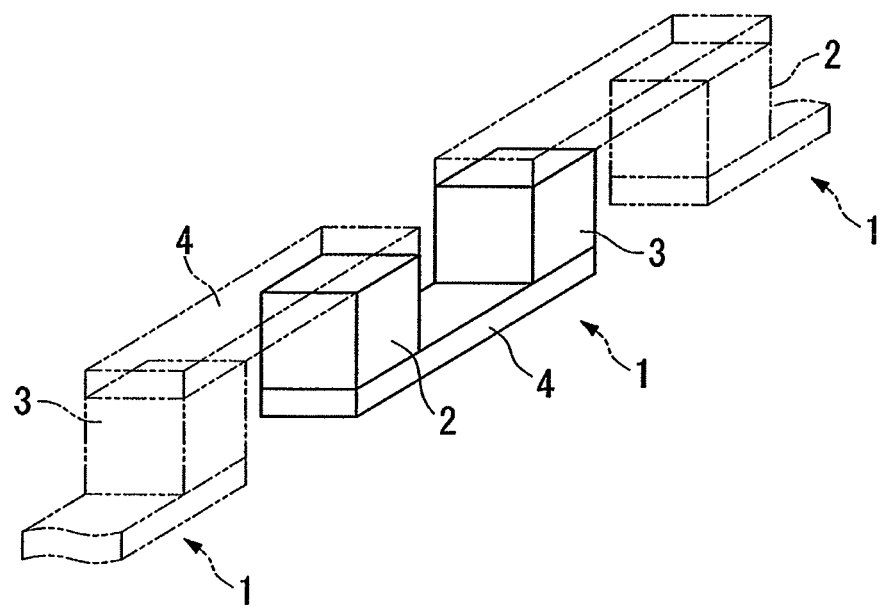
FIG. 27 is a perspective diagram schematically showing an example of a conventional thermoelectric module.

FIG. 22 shows thermoelectric module 1a of the present invention, which comprises a PN element pair as in the same manner as a conventional thermoelectric module 1 shown in FIG. 27. In the formation of the PN element pair, the P type thermoelectric semiconductor element 2a and N type thermoelectric semiconductor element 3a respectively manufactured by the method of the present invention are arranged so that the elements are aligned in the direction perpendicular both to the extending direction of C face and the direction of c-axis of hexagonal structure of the crystal grains 11. Conductive material processed surfaces of the thermoelectric semiconductor elements 2a and 3a opposed to each other in the extending direction of C face of the crystal grains are joined via a metal electrode 4.

As a result, in the above-described thermoelectric module 1a of the present invention, current and heat can be conveyed in the extending direction of C face of the crystal grains 11 of the P type thermoelectric semiconductor element 2a and N type thermoelectric semiconductor element 3a, in which the extending direction of C face and the direction of c-axis of crystal grains 11 are approximately uniformly oriented. Therefore, thermoelectric module 1a having an excellent thermoelectric performance can be achieved.

Figure 23:
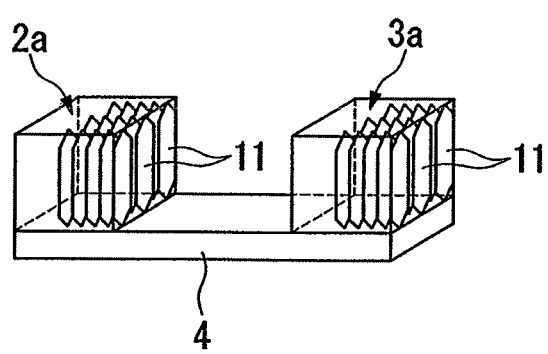
FIG. 23 is a schematic perspective diagram showing a comparative example for a thermoelectric module of FIG. 22.

In addition, when thermoelectric cooling, thermoelectric heating, thermoelectric power generation, and the like are carried out using the above-described thermoelectric module 1a, expansion or contraction of the metal electrode 4 accompany temperature deviation. Therefore, to adjacent P type and N type thermoelectric semiconductor elements 2a and 3a joined via a metal electrode 4, stress is applied in the direction in which the elements come close to each other, or move away from each other. While in the above-described thermoelectric module, when a PN element pair is formed as shown in FIG. 22, adjacent thermoelectric semiconductor elements 2a and 3a joined via a metal electrode 4 are arranged in the same plane as the direction of C face of crystal grains 11. Therefore, stress caused by expansion or contraction of the metal electrode 4 can be applied to respective crystal grains 11 only in the direction parallel to C plan. Accordingly, even when the stress is applied, interlayer peeling of the crystal grains 11 in the hexagonal structure in the respective structures of thermoelectric semiconductor elements 2a and 3a can be prevented, and thus, the damage to the thermoelectric semiconductor elements 2a and 3a due to cleavage can be prevented, and therefore, strength and durability of the thermoelectric module 1a can be enhanced. When a PN elemental pair is formed, as a comparative example as shown in FIG. 23, by aligning the P type and N type thermoelectric semiconductor elements 2a and 3a in the direction of c-axis in the hexagonal structure of crystal grains 11; and joining respective thermoelectric semiconductor elements 2a and 3a via metal electrode 4, the stress caused by expanding or contracting deformation of the metal electrode 4 due to thermal deviation is applied respectively to the thermoelectric semiconductor elements 2a and 3a in the direction of c-axis of crystal grains 11. Accordingly, the stress works to peel the layers in the hexagonal structure of these crystal grains 11. In such a case, the damage to thermoelectric semiconductor elements 2a and 3a due to cleavage may be easily occur. Such occurrence of damage can be prevented in the above-described thermoelectric module 1a of the present invention.

Figure 24A:
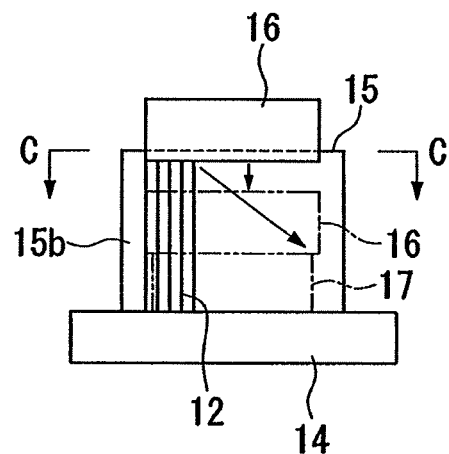
FIG. 24A is a schematic cross sectional side view showing another example of a plastic working device used in a plastically deforming process of FIG. 1.
Figure 24B:
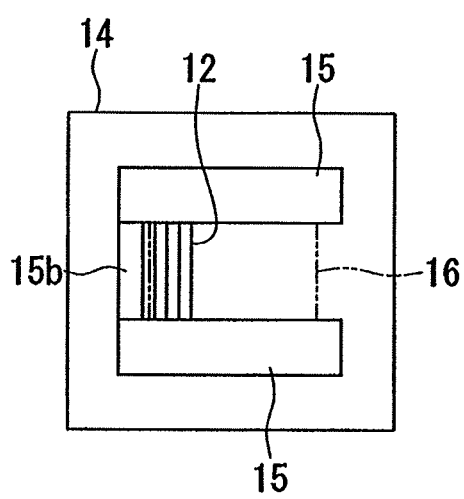
FIG. 24B is a diagram showing the device of FIG. 24A along line C-C in the direction of the arrows.
Figure 25A:
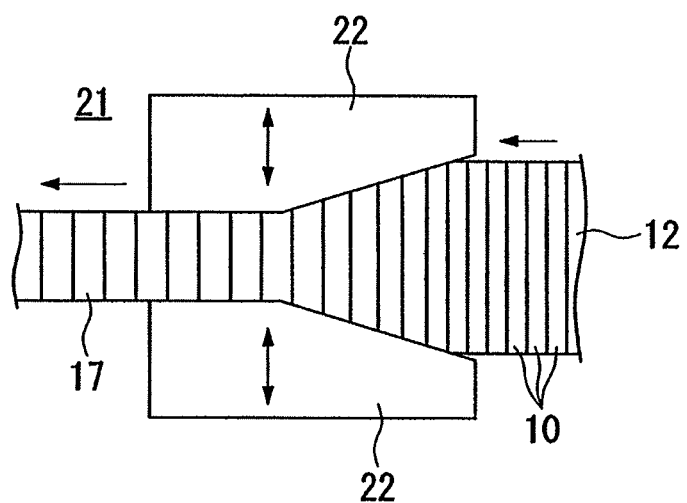
FIG. 25A is a schematic diagram showing an example of the plastically deforming process of FIG. 1 by another device, and showing a state in which a compact is plastically deformed by a high pressure press.
Figure 25B:
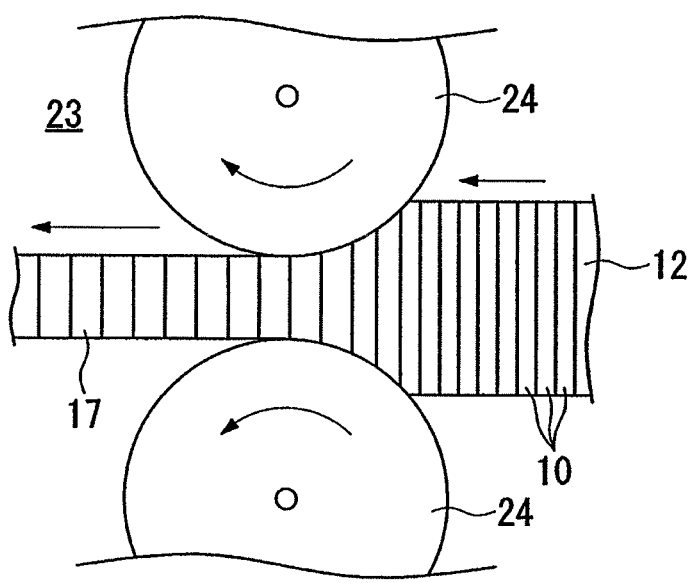
FIG. 25B is a schematic diagram showing an example of the plastically deforming process of FIG. 1 by another device, and showing a state in which a compact is plastically deformed by a rolling device.

The present invention is not limited only to the above-described embodiments. In the solidification forming process III in the manufacturing method for a thermoelectric semiconductor material, the above description shows a processing condition for solidifying and forming (sintering) the raw thermoelectric semiconductor material 10 at a temperature no lower than 380° C. and no higher than 500° C., preferably, a no lower than 420° C. and no higher than 450° C., is maintained for 5 seconds to 5 minutes. While, it is also possible to sinter raw thermoelectric semiconductor materials 10 for a long period of time at a temperature no higher than 400° C. When temperature conditions and heating time may be set so that segregation, dropping of separated phase, and liquid phase precipitation, or the like of the Te rich phases having a low melting point and are dispersed in complex compound semiconductor phases do not completely occur, it is possible to form a compact 12 through plastic deformation by applying pressure, rolling, or by extrusion. As a plastically processing device 13 used in plastically deforming process IV, a structure having a punch 16 which can be raised and lowered inside between restricting members 15 placed in the lateral direction is described. In this case, the compact 12 is placed in the middle portion inside the restricting members 15 placed in the lateral direction, and this compact 12 is pressed from above by punch 16, and thereby, the above-described compact 12 is expanded toward the two anteroposterior sides in a uniaxial direction parallel to the layering direction of raw thermoelectric semiconductor material 10. While, as shown in FIGS. 24A and 24B, the plastically working device 13 may have a configuration in which an additional restricting member 15b is provided in a position on one side of the base 14 between restricting members 15 placed in the lateral direction to restrict the deformation (expansion) of compact 12 in forward and backward direction in one direction. In this case, when compact 12 is plastically deformed, compact 12 is firstly placed so as to be contacted with the restricting members 15 placed in the lateral direction and the restricting member 15b. Subsequently, the compact 12 is pressed from above by punch 16 as shown by two-dot chain lines in the upper portion of FIG. 21. As a result, the compact 12 is expanded only in one direction opposite to the restricting member 15b. Plastically working device 13a used in omnidirectional hydrostatic pressure process IV-2 shown in FIGS. 20A, 20B, and 20C may be provided with a fixing position ring 15a same as that shown in FIG. 8D, on the outer periphery of restricting members 15 placed in the lateral direction and front and rear restricting members 18. In this case, during the plastic deformation of the compact 12, stress applied in the direction to the outside of the above-described restricting members 15 and 18 is received by the fixing position ring. When omnidirectional hydrostatic pressure process IV-2 is carried out two or more times, instead of preparing a plurality of plastically working device 13a having different spacing between front and rear restricting members 18, it is also possible to use a plastic working device 13a in which positions of front and rear restricting members 18 may be set to have selective spacing. While a composition of raw alloy for thermoelectric semiconductors is, in either case of P type or N type, described to have excess Te added to stoichiometric composition of the thermoelectric semiconductor complex compound, it is also possible to add as excess composition, any element selected from Bi, Se, and Sb element instead of Te to the stoichiometric composition of the thermoelectric semiconductor complex compound. A manufacturing method for a thermoelectric semiconductor material, a thermoelectric semiconductor element, and a thermoelectric module according to the present invention may be applied to the raw alloy having the stoichiometric composition of the thermoelectric semiconductor complex compound to which an excess Te is not added. In this case, improvement of thermoelectric performance can be expected due to an improvement of orientation of crystal grains 11 in the texture of thermoelectric semiconductor material 17. While $Bi_2(Te$—$Se)_3$ based, three element based composition was described as a stoichiometric composition of raw alloy for N type thermoelectric semiconductor, it is also possible to apply a manufacturing method for a thermoelectric semiconductor material, a thermoelectric semiconductor element, or a thermoelectric module to a raw alloy having a $Bi_2Te_3$ based, two element based, stoichiometric composition or a four element based stoichiometric composition comprising (Bi—$Sb)_2Te_3$ based composition added with small amount of Se. While (Bi—$Sb)_2Te_3$ based, three element based composition was described as a stoichiometric composition of P type thermoelectric semiconductor complex compound, it is also possible to apply a manufacturing method for a thermoelectric semiconductor material, a thermoelectric semiconductor element, or a thermoelectric module to a raw alloy having a four element based stoichiometric composition comprising $Bi_2(Te$—$Se)_3$ based composition added with small amount of Sb. In the above description, plastically working device 13 and 13a are used when a thermoelectric semiconductor material 17 is manufactured through plastic deformation by applying a shear force to a compact 12 in which slow cooling foils of raw thermoelectric semiconductor materials 10 are layered in the direction of the plate thickness and are solidified and formed, in a uniaxial direction approximately parallel to the layering direction of the above-described thermoelectric semiconductor element 10. A high pressure pressing device 21 with a pair of dies 22 that are moveable in the direction in which they come close to each other or they move away from each other as shown in FIG. 25A, or a rolling device 23 provide with a roller 24 as shown in FIG. 25B may be used to press the compact 12 in a uniaxial direction perpendicular to the layering direction while moving the compact in the main layering direction of raw thermoelectric semiconductor materials 10. In this case, since a friction is applied in the direction perpendicular to both the layering direction of the raw thermoelectric semiconductor material 10 and the direction of pressure application, the compact is not spread or even if it spreads, amount of deformation is limited to small value. Therefore, restricting members are not specifically required. Of course, a variety of modifications can be applied to the embodiments within the scope that does not deviate from the gist of the present invention.

EXAMPLE

A thermoelectric module 1a was manufactured by forming a PN element pair of P type and N type thermoelectric semiconductor elements 2a and 3a manufactured by a manufacturing method for a thermoelectric semiconductor element of the present invention. The thermoelectric performance of the module was compared with that of a thermoelectric module manufactured in accordance with another method.

Figure 26:
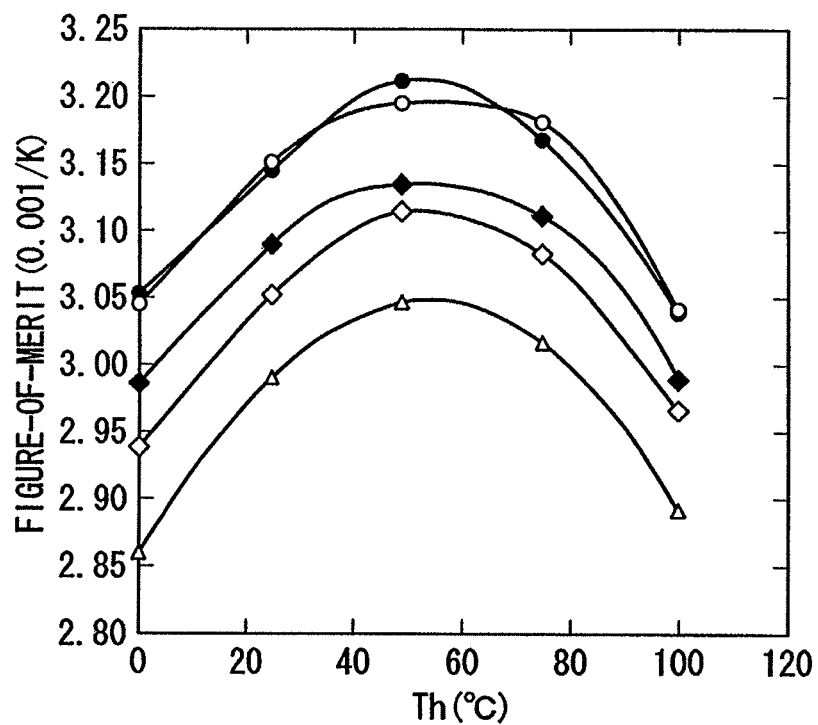
FIG. 26 is a graph showing the results of the comparison of the thermoelectric performance of a thermoelectric module manufactured by the manufacturing method of the present invention with that of a thermoelectric module manufactured by another manufacturing method.

As a result, the Figure-of-Merit, shown by solid circle ● and open circle ○ in FIG. 26, were obtained as the thermoelectric performance of thermoelectric module 1a manufactured in accordance with the present invention.

The result indicates, it was found that high thermoelectric performance is gained according to the invention, As a result, thermoelectric module of the present invention indicates high thermoelectric performance in comparison with a case in which a P type thermoelectric semiconductor element and an N type thermoelectric semiconductor element are both manufactured only by conventional hot pressing of a raw thermoelectric semiconductor material according (shown by open triangle Δ in FIG. 26), and a case in which N type thermoelectric semiconductor element 2a is manufactured by a manufacturing method for a thermoelectric semiconductor element of the present invention, while a P type thermoelectric semiconductor element is manufactured only by hot pressing of a raw thermoelectric semiconductor material (shown by open diamond ◇ and solid diamond ◆ in FIG. 26).

What is claimed is:

1. A method of producing a thermoelectric semiconductor material, the method comprising:
adding excess Te to a predetermined stoichiometric composition of a compound thermoelectric semiconductor to form a raw alloy;
melting the raw alloy to form a molten alloy;
solidify the molten alloy to form plate shaped raw thermoelectric semiconductor materials, by supplying the molten alloy to a surface of a rotational roll which is configured to act as a cooling member to slowly cool the molten alloy;
layering and packing the plate shaped raw thermoelectric semiconductor materials to form a layered body;
solidifying and forming the layered body to form a compact;
plastically deforming the compact to form a thermoelectric semiconductor material, by applying pressure to the compact in uniaxial direction perpendicular or nearly perpendicular to a main layering direction of the raw thermoelectric semiconductor materials so as to apply shear force to the compact in uniaxial direction approximately parallel to the main layering direction of the raw thermoelectric semiconductor materials, wherein the thermoelectric semiconductor material formed has a compound phase which includes:
a complex compound semiconductor phase having the predetermined stoichiometric composition, and
a Te rich phase in which excess Te is included to the stoichiometric composition.

2. The method of producing the thermoelectric semiconductor material according to claim 1, wherein the stoichiometric composition of the compound thermoelectric semiconductor is a (Bi—$Sb)_2Te_3$ based composition.

3. The method of producing the thermoelectric semiconductor material according to claim 1, wherein the stoichiometric composition of the compound thermoelectric semiconductor is a $Bi_2(Te$—$Se)_3$ based composition.

4. The method of producing a thermoelectric semiconductor element, the method comprising:
adding excess Te to a predetermined stoichiometric composition of a compound thermoelectric semiconductor to form a raw alloy;
melting the raw alloy to form a molten alloy;
solidify the molten alloy to form plate shaped raw thermoelectric semiconductor materials, by supplying the molten alloy to a surface of a rotational roll which is configured to act as a cooling member to slowly cool the molten alloy;
layering and packing the plate shaped raw thermoelectric semiconductor materials to form a layered body;

solidifying and forming the layered body to form a compact;

plastically deforming the compact to form a thermoelectric semiconductor material by applying pressure to the compact in uniaxial direction perpendicular or approximately perpendicular to a main layering direction of the raw thermoelectric semiconductor materials so as to apply shear force to the compact in uniaxial direction approximately parallel to the main layering direction of the raw thermoelectric semiconductor materials; and cutting out a thermoelectric semiconductor element from the thermoelectric semiconductor material so that a plane of the element, approximately perpendicular to uniaxial direction in which the shear force is applied during the plastic deformation of the compact, is configured as a contact surface with an electrode;

wherein the thermoelectric semiconductor material formed has a compound phase which includes a complex compound semiconductor phase having the predetermined stoichiometric composition, and a Te rich phase in which excess Te is included to the predetermined stoichiometric composition.

5. The method of producing the thermoelectric semiconductor element according to claim 4, wherein the stoichiometric composition of the compound thermoelectric semiconductor is a $(Bi\text{---}Sb)_2Te_3$ based composition.

6. The method of producing the thermoelectric semiconductor element according to claim 4, wherein the stoichiometric composition of the compound thermoelectric semiconductor is a $Bi_2(Te\text{---}Se)_3$ based composition.

7. The method of producing a thermoelectric module comprising a PN element pair, the method comprising:

adding excess Te to a first stoichiometric composition of a P type thermoelectric semiconductor to form a first raw alloy, and adding excess Te to a second stoichiometric composition of a N type thermoelectric semiconductor to form a second raw alloy;

melting the first raw alloy to form a first molten alloy; and melting the second raw alloy to form a second molten alloy; and solidify the first molten alloy to form first plate shaped raw thermoelectric semiconductor materials, by supplying the first molten alloy to a surface of a rotational roll which is configured to act as a cooling member to slowly cool the first molten alloy; and solidify the second molten alloy to form second plate shaped raw thermoelectric semiconductor materials, by supplying the second molten alloy to a surface of a rotational roll which is configured to act as a cooling member to slowly cool the second molten alloy;

layering and packing the first plate shaped raw thermoelectric semiconductor materials to form a first layered body; and layering and packing the second plate shaped raw thermoelectric semiconductor materials to form a second layered body;

solidifying and forming the first layered body to form a first compact; and solidifying and forming the second layered body to form a second compact;

plastically deforming the first compact to form P type thermoelectric semiconductor materials, by applying pressure to the first compact in uniaxial direction perpendicular or approximately perpendicular to a main layering direction of the first raw thermoelectric semiconductor materials so as to apply shear force to the first compact in uniaxial direction approximately parallel to the main layering direction of the first raw thermoelectric semiconductor material; and plastically deforming the second compact to form N type thermoelectric semiconductor materials, by applying pressure to the second compact in uniaxial direction perpendicular or approximately perpendicular to a main layering direction of the second raw thermoelectric semiconductor materials so as to apply shear force to the second compact in uniaxial direction approximately parallel to the main layering direction of the second raw thermoelectric semiconductor materials;

cutting out P type thermoelectric semiconductor elements from the P type thermoelectric semiconductor materials such that planes of the P type elements, approximately perpendicular to uniaxial direction in which the shear force is applied during the plastic deformation of the first compact, are configured as contact surfaces with an electrode; and cutting out N type thermoelectric semiconductor elements from the N type thermoelectric semiconductor materials such that planes of the N type elements, approximately perpendicular to uniaxial direction in which the shear force is applied during the plastic deformation of the second compact, are configured as contact surfaces with an electrode; and arranging the P type thermoelectric semiconductor elements such that the P type elements are aligned in uniaxial direction perpendicular to uniaxial direction in which the pressure is applied and uniaxial direction in which the shear force is applied by pressure application during plastic deformation of the first compact; and arranging the N type thermoelectric semiconductor elements such that the N type elements are aligned in uniaxial direction perpendicular to uniaxial direction in which the pressure is applied and uniaxial direction in which the shear force is applied by pressure application during plastic deformation of the second compact; and joining the P type and N type thermoelectric semiconductor elements via a metal electrode to form a thermoelectric module comprising a PN element pair;

wherein the P type and N type thermoelectric semiconductor materials formed have a compound phase which includes, complex compound semiconductor phase having the predetermined stoichiometric composition, and a Te rich phase in which excess Te is included to the predetermined stoichiometric composition.

8. The method of producing the thermoelectric module according to claim 7, wherein the stoichiometric composition of the P type compound thermoelectric semiconductor is a $(Bi\text{---}Sb)_2Te_3$ based composition.

9. The method of producing the thermoelectric semiconductor element according to claim 7, wherein the stoichiometric composition of the N type compound thermoelectric semiconductor is a $Bi_2(Te\text{---}Se)_3$ based composition.

* * * * *

UNITED STATES PATENT AND TRADEMARK OFFICE
CERTIFICATE OF CORRECTION

PATENT NO. : 8,884,152 B2
APPLICATION NO. : 14/187858
DATED : November 11, 2014
INVENTOR(S) : Toshinori Ota et al.

It is certified that error appears in the above-identified patent and that said Letters Patent is hereby corrected as shown below:

Title Page, should read,

(72) Inventors: Toshinori Ota, Tokyo (JP); Hiroki Yoshizawa, Funabashi (JP); Kouiti Fujita, Miura (JP); Isao Imai, Fujisawa (JP); Tsuyoshi Tosho, Hokkaido (JP); Ujihiro Nishiike, Tokyo (JP)

Signed and Sealed this
Seventh Day of April, 2015

Michelle K. Lee
*Director of the United States Patent and Trademark Office*